(12) United States Patent
McNeill et al.

(10) Patent No.: US 7,312,734 B2
(45) Date of Patent: Dec. 25, 2007

(54) CALIBRATABLE ANALOG-TO-DIGITAL CONVERTER SYSTEM

(75) Inventors: John A. McNeill, Stow, MA (US); Michael C. Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/349,400

(22) Filed: Feb. 6, 2006

(65) Prior Publication Data
US 2006/0176197 A1      Aug. 10, 2006

Related U.S. Application Data

(60) Provisional application No. 60/650,658, filed on Feb. 7, 2005.

(51) Int. Cl.
*H03M 1/12* (2006.01)
(52) U.S. Cl. .................................. 341/120
(58) Field of Classification Search ............... 341/118, 341/120
See application file for complete search history.

(56) References Cited

U.S. PATENT DOCUMENTS

| | | | | |
|---|---|---|---|---|
| 5,471,208 | A | * | 11/1995 | Sauer ..................... 341/120 |
| 6,081,215 | A | * | 6/2000 | Kost et al. ................ 341/120 |
| 6,445,317 | B2 | * | 9/2002 | Lundin et al. ............ 341/120 |
| 6,452,518 | B1 | * | 9/2002 | Kawabata ................ 341/118 |

OTHER PUBLICATIONS

Morin et al., An Intellectual Property Module for Auto Calibration of Time-Interleaved Pipelined Analog-to-Digital Converters, IEEE, Proceedings. 4th IEEE International Workshop on System-on-Chip for Real-Time Applications, Jul. 19-21, 2004, pp. 111-114.*
Dyer et al., A Comparison of Monolithic Background Calibration in Two Time-Interleaved Analog-to-Digital Converters, IEEE, Proceedings of the 1998 IEEE International Symposium on Circuits and Systems, ISCAS '98. May 31-Jun 3, 1998, pp. 13-16 vol. 1.□□.*
H. Liu et al., "A 15b 20MS/s CMOS Pipelined ADC with Digital Background Calibration," *ISSCC Dig. Tech. Papers*, pp. 454-455, Feb. 2004.
K. Nair and R. Harjani, "A 96dB SFDR 50MS/s Digitally Enhanced CMOS Pipelined A/D Converter," *ISSCC Dig. Tech. Papers*, pp. 456-457, Feb. 2004.
S. Ryu et al., "A 14b-Linear Capacitor Self-Trimming Pipelined ADC," *ISSCC Dig. Tech. Papers*, pp. 464-465, Feb. 2004.
H.-S. Lee, "A 12-b 600 ks/s Digitally Self-Calibrated Pipelined Algorithmic ADC," *IEEE J. Solid-State Circuits*, vol. 29, No. 4, pp. 509-515, Apr. 1994.

(Continued)

*Primary Examiner*—Howard L. Williams
(74) *Attorney, Agent, or Firm*—Iandiorio & Teska

(57) ABSTRACT

A calibratable analog-to-digital converter system with a split analog-to-digital converter architecture including N Analog-to-Digital Converters (ADCs) each configured to convert the same analog input signal into a digital signal. Calibration logic is responsive to the digital signals output by the N ADCs and is configured to calibrate each of the ADCs based on the digital signals output by each ADC.

33 Claims, 20 Drawing Sheets

OTHER PUBLICATIONS

J. McNeill, M. Coln, and B. Larivee, "'Split-ADC' Architecture for Deterministic Digital Background Calibration of a 16b 1MS/s ADC," *ISSCC Dig. Tech. Papers*, Feb. 2005.

J. McNeill, M. Coln, and B. Larivee, "'Split-ADC' Architecture for Deterministic Digital Background Calibration of a 16b 1MS/s ADC," *IEEE J. Solid-State Circuits*, vol. 40, No. 12, pp. 2437-2445, Dec. 2005.

Karanicolas et al., "A 15-b 1MSample/s Digitally Self-Calibrated Pipeline ADC," *IEEE J. Solid-State Circuits*, vol. 28, No. 12, pp. 1207-1215, Dec. 1993.

O. E. Erdogan, P.J. Hurst, and S. H. Lewis, "A 12-b Digital-Background-Calibrated Algorithmic ADC With -90-dB THD," *IEEE J. Solid-State Circuits*, vol. 34, No. 12, pp. 1812-1820, Dec. 1999.

Y. Chiu; C. W. Tsang, B. Nikolic, and P. R. Gray, "Least Mean Square Adaptive Digital Background Calibration of Pipelined Analog-to-Digital Converters," *IEEE Trans. Circuits and Systems I*, vol. 51, No. 1, pp. 38-46, Jan. 2004.

Y. Chiu, "A 1.8V 14b 10MS/s Pipelined ADC in 0.18μm CMOS with 99dB SFDR," *ISSCC Dig. Tech. Papers*, pp. 458-459, Feb. 2004.

J. Li, G. Ahn, D. Chang, and U. Moon, "0.9V 12mW 2MSps Algorithmic ADC with 81dB SFDR," *VLSI Symposium Dig. Tech. Papers*, pp. 436-439, 2004.

J. Li and U. Moon, "Background Calibration Techniques for Multistage Pipelined ADCs With Digital Redundancy," *IEEE Trans. Circuits and Systems II*, vol. 50, No. 9, pp. 531-538, Sep. 2003.

I. Galton, "Digital Cancellation of D/A Converter Noise in Pipelined A/D Converters," *IEEE Transactions on Circcuits and Systems-II: Analog and Digital Signal Processing*, vol. 47, No. 3, pp. 185-196, Mar. 2000.

B. Murmann and B. E. Boser, "A 12b 75MS/s Pipelined ADC using Open-Loop Residue Amplification," *ISSCC Dig. Tech. Papers*, pp. 328-329, Feb. 2003.

\* cited by examiner

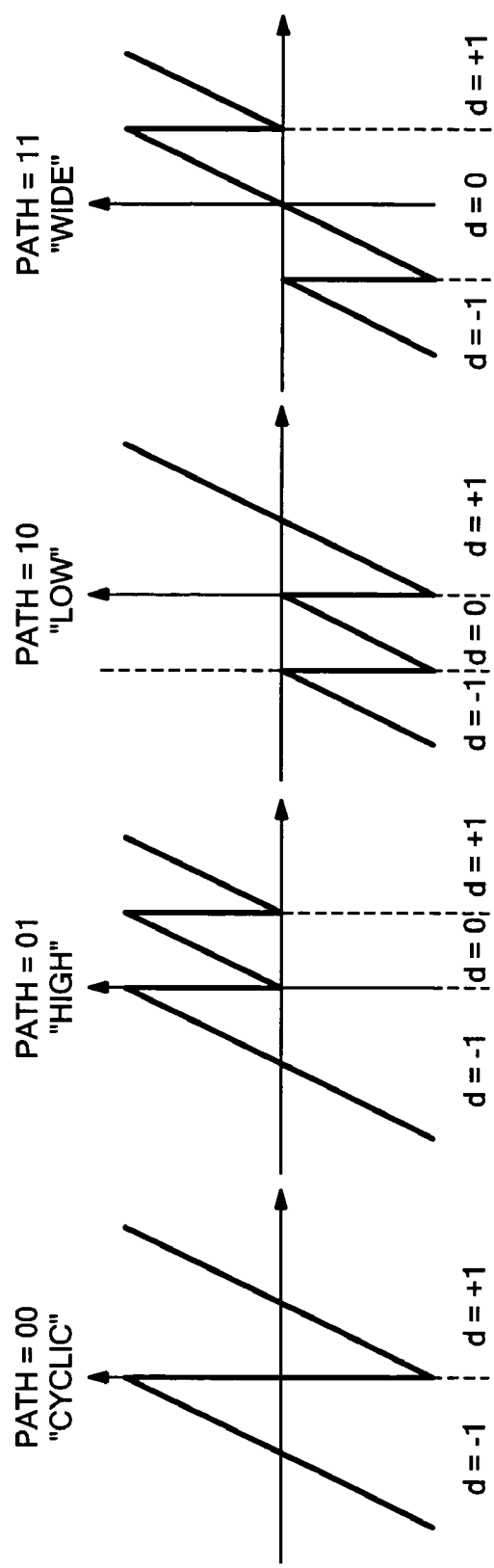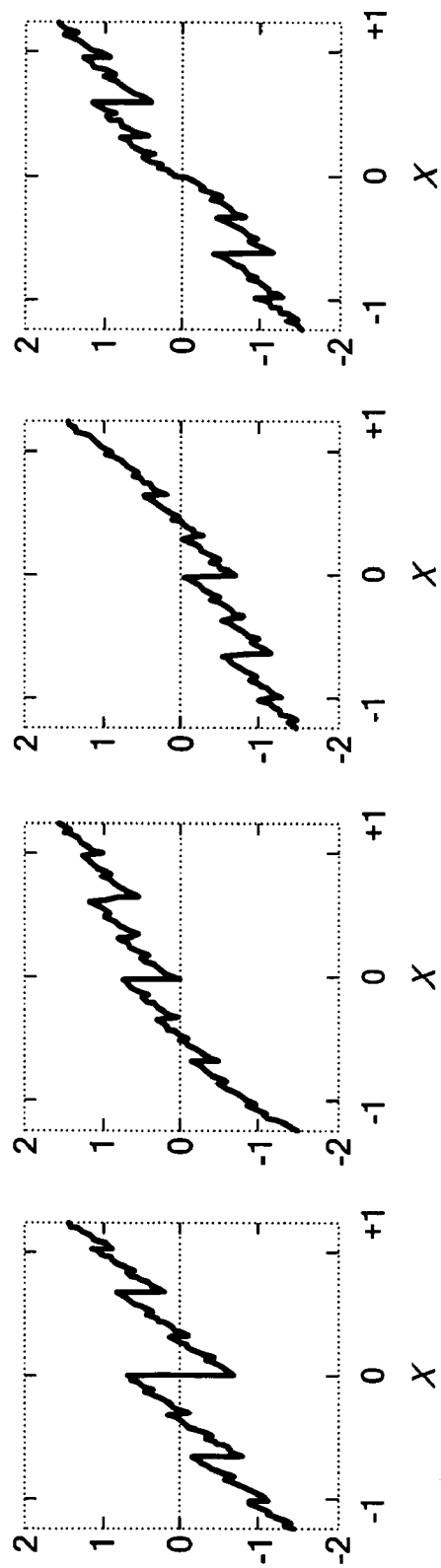

CALIBRATABLE ANALOG-TO-DIGITAL CONVERTER SYSTEM

RELATED APPLICATIONS

This application claims benefit of U.S. Provisional Application No. 60/650,658, filed Feb. 7, 2005, entitled "Calibratable Analog-to-Digital Converter System".

FIELD OF THE INVENTION

This subject invention relates to analog-to-digital converters.

BACKGROUND OF THE INVENTION

The many versions of analog-to-digital converters function to convert an analog input signal into a digital output signal by sampling the analog input signal at a sample rate and providing a digital representation of each sample to a specific resolution. 16 bit resolution analog-to-digital converters (ADCs) with 1 Ms/s sample rates are known.

Although each specific ADC architecture has its own inherent functionality regarding how the ADC decides what digital value is assigned to a specific sample of the input analog signal, all ADCs require calibration due to non-linearities, offsets, and/or gain and other errors. At the factory, an ADC can be calibrated in the rather straightforward manner by injecting a known analog input signal into the ADC and adjusting the ADC until the desired digital signal is output. But, for example, if a given ADC output is adjusted to be more linear at the factory, non-linearities and other errors can still result when the ADC is placed into service due to a variety of factors including changes in operating conditions such as temperature.

Thus, those skilled in the art have devised self calibrating ADCs and numerous ADC calibration techniques are known in the art. The following references are included herein by this reference: I. Galton, "Digital Cancellation of D/A Converter Noise in Pipelined A/D Converters," *IEEE Trans. Circ. Syst. II*, pp. 185-196, March 2000; B. Murmann and B. E. Boser, "A 12b 75 MS/s Pipelined ADC using Open-Loop Residue Amplification," *ISSCC Dig. Tech. Papers*, pp. 328-329, February 2003; H. Liu et al., "A 15b 20 MS/s CMOS Pipelined ADC with Digital Background Calibration," *ISSCC Dig. Tech. Papers*, pp. 454-455, February 2004; K. Nair and R. Haijani, "A 96 dB SFDR 50 MS/s Digitally Enhanced CMOS Pipelined A/D Converter," *ISSCC Dig. Tech. Papers*, pp. 456-457, February 2004; S. Ryu et al., "A 14b-Linear Capacitor Self-Trimming Pipelined ADC," *ISSCC Dig. Tech. Papers*, pp. 464-465, February 2004; and H.-S. Lee, "A 12-b 600 ks/s digitally self-calibrated pipelined algorithmic ADC," *IEEE J. Solid-State Circuits*, pp. 509-515, April 1994.

Some calibration techniques are non-deterministic and therefore slow since if there are $2^N$ bits, then $2^{2N}$ samples are required to complete calibration. Indeed, calibration can take minutes or even as long as an hour using non-deterministic calibration techniques. During this time, the ADC is not performing its desired function of accurately converting the analog input signal into a digital signal.

Moreover, some calibration techniques are carried out in analog circuitry as opposed to digital circuitry which is problematic because of the added complexity of analog circuitry and the desirability of maintaining a purely digital system especially in CMOS implementations.

Other ADC calibration techniques function in the foreground rather than in the background. If calibration occurs in the foreground, the ADC is taken off line during calibration and the ADC does not, during calibration, perform its intended function of converting the analog input signal into a digital output signal.

Indeed, one study of the prior art reveals that no presently known ADC calibration technique is deterministic, digital (in the sense of adding no analog complexity), and also occurs in the background.

Other problems facing ADC designers are limited die area, limited power availability, and noise. That is, any viable ADC architecture and calibration scheme would limit the amount of die area occupied, the power consumed, and the noise introduced.

SUMMARY OF THE INVENTION

It is therefore an object of this invention to provide an analog-to-digital converter system which is self-calibrating.

It is a further object of this invention to provide an analog-to-digital converter calibration technique which is deterministic, digital, and which also occurs in the background.

It is a further object of this invention to provide an analog-to-digital converter which occupies limited die area, uses limited power, and introduces limited noise.

It is a further object of this invention to provide a calibratable analog-to-digital converter which is highly versatile and can be implemented using a number of different analog-to-digital converter architectures.

The subject invention results from the realization that by splitting an analog-to-digital converter system into an architecture with multiple analog-to-digital converters each configured to convert the same analog input signal into a digital signal and by calibrating the multiple analog-to-digital converters based on the output digital signals they produce, then the calibration process can be made deterministic, based on digital circuitry, and to occur in the background, and, preferably, but not necessarily, all three. At the same time, the system occupies little more die area, consumes little added power, and introduces little additional noise than an analog-to-digital converter without such a split architecture.

The subject invention, however, in other embodiments, need not achieve all these objectives and the claims hereof should not be limited to structures or methods capable of achieving these objectives.

This subject invention features a calibratable analog-to-digital converter system comprising a split analog-to-digital converter architecture including N (2 or more) Analog-to-Digital Converters (ADCs) each configured to convert the same analog input signal into a digital signal. Calibration logic, responsive to the digital signals output by the N ADCs, is configured to calibrate each of the ADCs based on the digital signals output by the set of ADCs.

Typically, averaging logic is included for averaging the digital signals output by the ADCs to produce a system output signal. Also, logic for differencing the digital signals output by the ADCs is provided and the calibration logic is responsive to the differencing and configured to calibrate the ADCs until the difference in the digital signals output by the ADCs is minimized.

Preferably, each ADC includes redundancy and the calibration logic is configured to drive the ADCs to produce their digital signals based on the analog input signal via a different sequence of decisions. Then, the calibration logic is responsive to the decisions of each ADC and also the differences between the digital signals output by each ADC and the calibration logic is configured to calculate the errors in each ADC and to drive the errors to a minimum.

The subject invention is useful in a wide variety of ADC architectures: SAR, cyclic, and pipeline ADC architectures, for example, the ADCs may also be interleaved. Beneficially, each ADC can be made to occupy 1/N of the die area of the system and to consumes 1/N of the power of the system. The preferred system calibration logic is deterministic, background, and digital.

A calibratable analog-to-digital converter system in accordance with this invention includes a split analog-to-digital converter architecture including N individually redundant Analog-to-Digital Converters (ADCs) each configured to convert the same analog input signal into a digital signal, logic for differencing the digital signals output by the ADCs, and calibration logic configured to drive the ADCs to produce their digital signals based on the analog input signal via a different sequence of decisions and to calculate the errors in each ADC and to drive the errors to a minimum.

An analog-to-digital converter calibration method in accordance with the subject invention includes driving N Analog-to-Digital Converters (ADCs) to each convert the same analog input signal into N digital signals and using the N digital signals output by the ADCs to calibrate each ADC. The step of averaging the digital signals output by the ADCs to produce a system output signal may also be included. So too may the step of differencing the digital signals output by the ADCs and using the difference to calibrate the ADCs.

Typically, calibration includes driving the ADCs to produce their digital output signal based on the analog input signal via a different sequence of decisions. The errors in each ADC are calculated and driven to a minimum. Preferably, calibration is performed deterministically, in the background, and in the digital domain.

One ADC calibration method features driving N Analog-to-Digital Converters (ADCs) to each convert the same analog input signal into N digital signals, and calibrating each of the ADCs based on the digital signal output by the set of ADCs.

Another calibratable analog-to-digital converter system in accordance with the subject invention features a split Analog-to-Digital Converter (ADC) architecture including N ADCs each configured to convert an analog input signal into a digital signal. Calibration logic is configured to calibrate one ADC while at least one other ADC converts the analog signal into a digital signal and to calibrate a different ADC while at least another ADC converts the analog signal into a digital signal. There may be first and second ADCs. The calibration logic is typically configured to calibrate the first ADC while the second ADC provides its digital signal as the system output signal and to calibrate the second ADC while the first ADC provides its digital signal as the system output signal. When there are more than two ADCs, the calibration logic is configured to calibrate one ADC while the other ADCs provide digital signals averaged to produce the system output signal.

BRIEF DESCRIPTION OF THE DRAWINGS

Other objects, features and advantages will occur to those skilled in the art from the following description of a preferred embodiment and the accompanying drawings, in which:

FIGS. 27-34 show the four possible residue modes and associated error estimation parameters;

DISCLOSURE OF THE PREFERRED EMBODIMENTS

Figure 1:
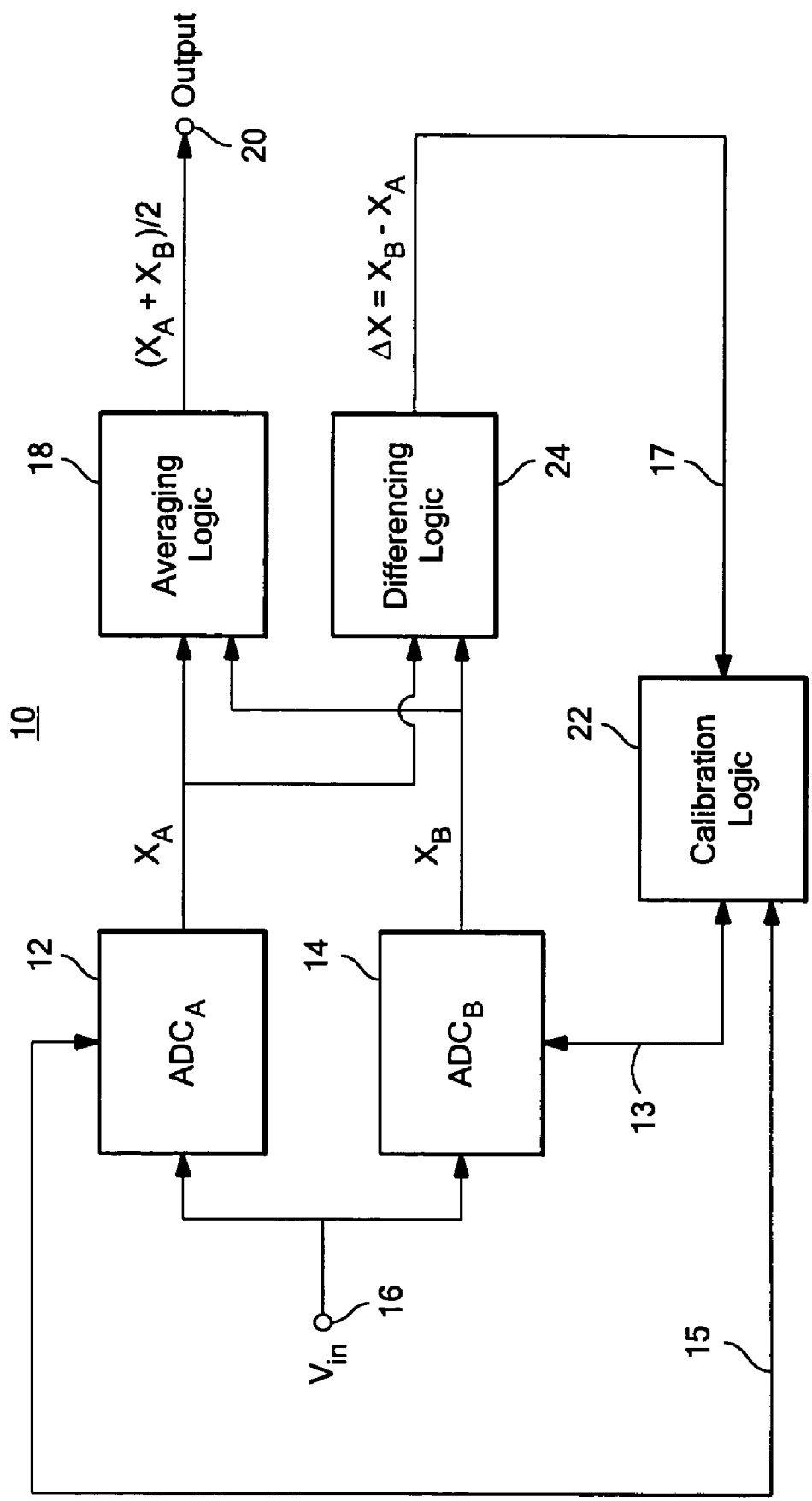
FIG. 1 is a highly schematic block diagram of one example of a calibratable analog-to-digital converter system in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Calibratable analog-to-digital converter system 10, FIG. 1 includes a novel split analog-to-digital converter architecture with at least two analog-to-digital converters (ADCs) 12 and 14 ($ADC_A$ and $ADC_B$) each typically configured to convert the same analog signal at input 16 to a digital signal. Thus, $ADC_A$ outputs digital signal XA and $ADC_B$ outputs digital signal $X_B$. In a typical implementation, averaging logic 18 averages the digital output signals of both ADCs to produce a system output code at 20. Thus, in FIG. 1, the output code is $(X_A+X_B)/2$. Calibration logic 22 is responsive to the individual digital signals output by $ADC_A$ and $ADC_B$ and is configured to calibrate each of the ADCs based on their output signals $X_A$ and $X_B$. In one typical implementation, differencing logic 24 subtracts the signals output by $ADC_A$ from the signal output by $ADC_B$ and calibration logic 22 uses this difference ($\Delta X$) to calibrate each ADC until the difference between the digital signals output by $ADC_A$ and $ADC_B$ is minimized, e.g., zero.

In this way, either both ADCs are properly calibrated or they, by chance, each have the same calibration error. Thus, it is preferable in the best mode to select architectures for $ADC_A$ and $ADC_B$ with redundancy and to design calibration logic 22 to drive each ADC to produce its digital signal via a different sequence of decisions or "paths", as explained below.

Typically, calibration logic 22 is responsive to the decisions made by each ADC via channels 13 and 15. Logic 22 is also responsive to the differences between the digital signal output by each ADC on channel 17 and calibration logic 22 is configured to calculate the errors in each ADC and to drive the errors to a minimum. Typical architectures for ADCs 12 and 14 include cyclic, SAR, and pipeline ADC architectures as discussed more fully below. If there are N ADCs, (2 or more), each ADC may be designed to occupy 1/N of the die area of the system, and to consume 1/N of the power of the system. In a preferred embodiment, calibration logic 22 is deterministic, designed to effect calibration in the background, and is implemented wholly in digital circuitry. In one particular example, the ADCs may be interleaved as discussed more fully below.

The trend in submicron CMOS ADC design is toward all-digital self-calibrating ADC architectures. The calibration of an N-bit converter by statistical, non-deterministic means requires approximately $2^{2N}$ conversions. Although this is adequate for ADCs of high speed and moderate resolution, higher resolution converters have required calibration times of seconds or minutes. In contrast, the "split ADC" architecture shown in FIG. 1 enables a deterministic digital calibration procedure which operates continuously in the background, and requires only approximately 10,000 conversions to complete calibration.

As shown, the ADC is split into two channels, each converting the same input and producing individual output codes $X_A$ and $X_B$. The average of the two outputs is the ADC output code at node 20. The background calibration signal is developed from the difference $\Delta X$ between codes $X_A$ and $X_B$. If both ADCs are correctly calibrated, the two outputs agree and the difference $\Delta X=0$. In the presence of nonzero differences, the pattern of "disagreements" in $\Delta X$ is examined by calibration logic 22 to adjust the calibration parameters in each ADC, driving the $\Delta X$ and the ADC errors to zero.

Comparison with statistical techniques shows the advantage of using $\Delta X$ for the calibration signal. When the prior art employed pseudorandom (PR) sequences to decorrelate the calibration information from the unknown ADC input signal, a large number of conversions was required. In the split ADC approach of this invention, in contrast, the difference operation at block 24 removes the unknown ADC input from the calibration signal path, so no decorrelation is necessary and the number of conversions required is greatly reduced. Moreover, the impact on analog complexity and performance (speed, power, and noise) is negligible.

Figure 2:
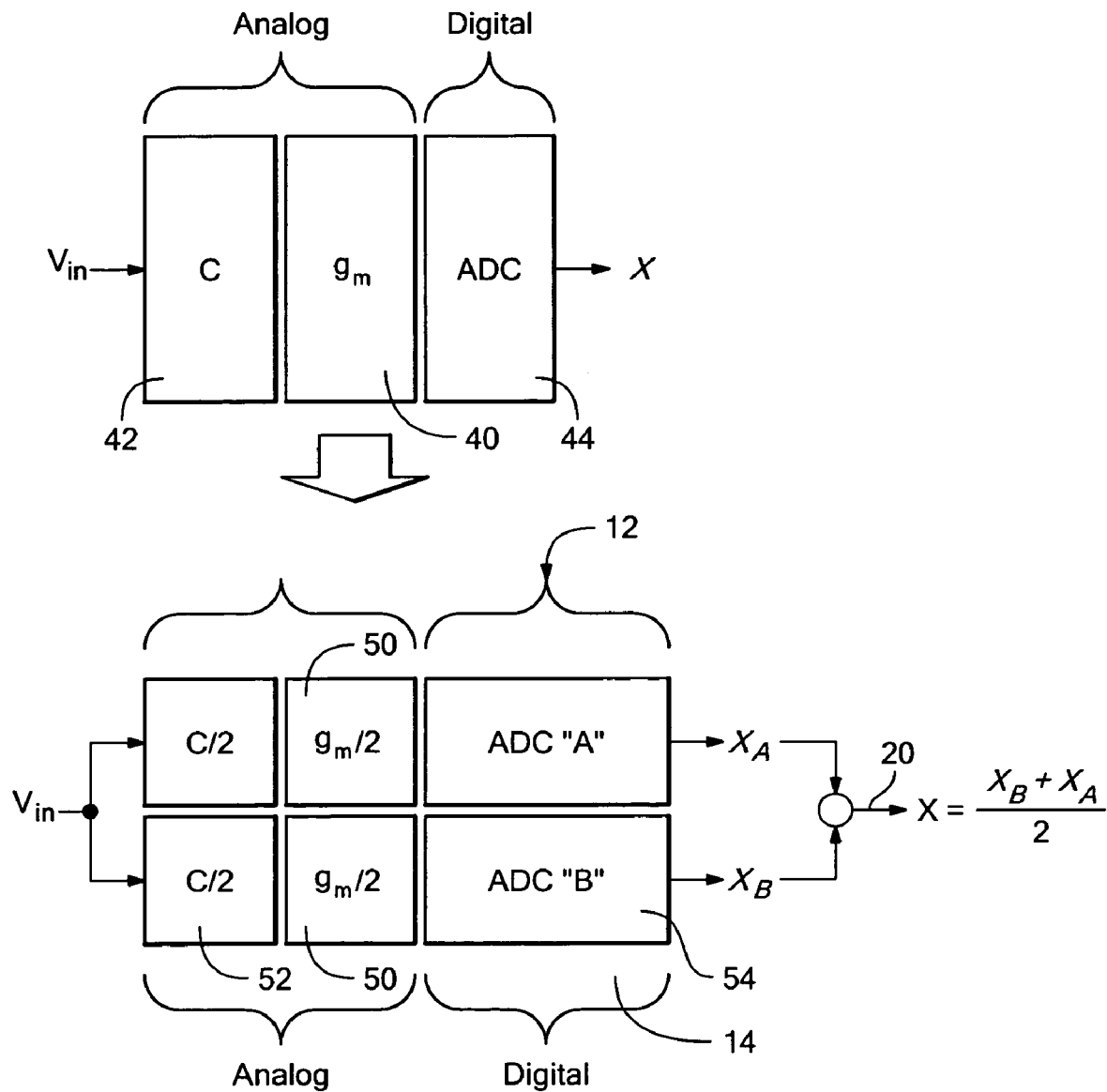
FIG. 2 is another highly schematic block diagram showing the difference between a typical prior art analog-to-digital converter compared to the split or dual channel analog-to-digital converter architecture of the subject invention.

Splitting a single ADC into two ADCs running in parallel and converting the same input voltage is represented in block form in FIG. 2.

The outputs $X_A$ and $X_B$ of each ADC are corrected individually using estimated parameters for overall gain error, offset error, and cyclic gain error. The average of these two is reported as the output code. The difference $X_B-X_A$ is also examined: if the estimated parameters are correct, then the two outputs will agree and the difference should be zero. The premise is that any disagreement between the two path output codes is due to an error in one or more of the parameter estimates and observing the pattern of differences over a sufficient number of conversions provides information for correcting the parameter estimates. The details of the estimation process are discussed below.

The pattern of differences is typically determined by forcing the cyclic amplifiers into different residue modes. The multiple residue mode cyclic amplifier is described in detail infra.

In one implementation, the novel split ADC architecture enables self-calibration of a 16 bit ADC in approximately 10,000 conversions (10 msec at 1 MS/s conversion rate). This is three to five orders of magnitude faster than previous approaches which required seconds or minutes to calibrate to 14-15 bit accuracy. Table 1 is a performance summary table for an ADC system in accordance with the subject invention:

TABLE 1

| Technology | 0.25 μm 1P4M CMOS |
|---|---|
| Supply Voltage | 2.5 V |
| Resolution | 16 b |
| Conversion Rate | 1 MS/s |
| SNR | 89 dB |
| INL | +2.1/−4.8 LSB |
| DNL | +0.66/−0.47 LSB |
| Power Consumption * | 105 mW |
| Die Area * | 1.16 mm × 1.38 mm |

* excludes digital on FPGA

Figure 3:
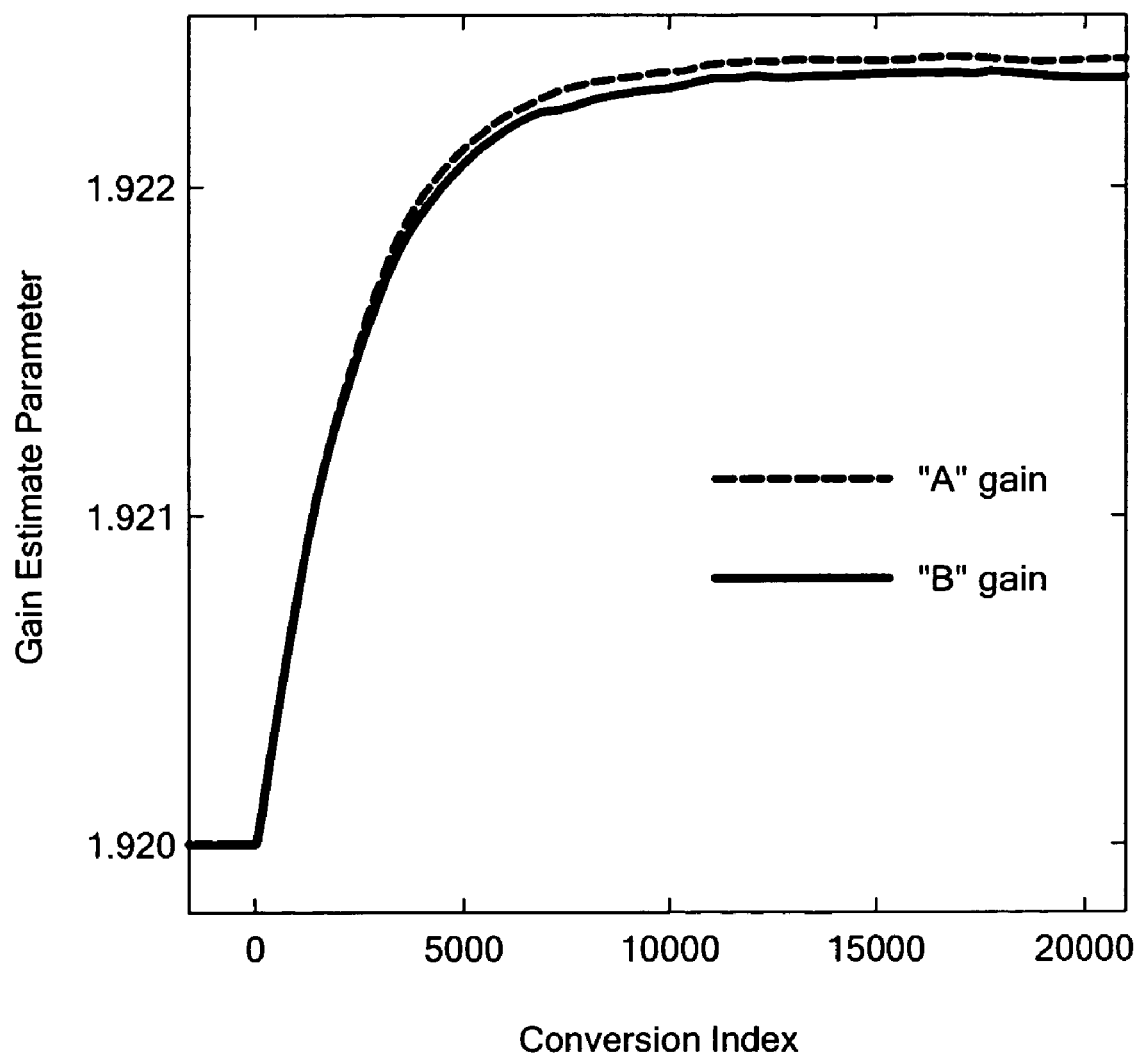
FIG. 3 is a graph showing the gain estimate calibration parameter compared to a conversion index indicating time in number of conversions for an embodiment of a calibratable analog-to-digital converter system in accordance with the subject invention.

FIG. 3 shows a plot of the gain estimate as a function of time, showing the acquisition transient of the calibration.

The response is a damped exponential and calibration is acquired to sufficient accuracy within about 10,000 conversions.

Figure 4:
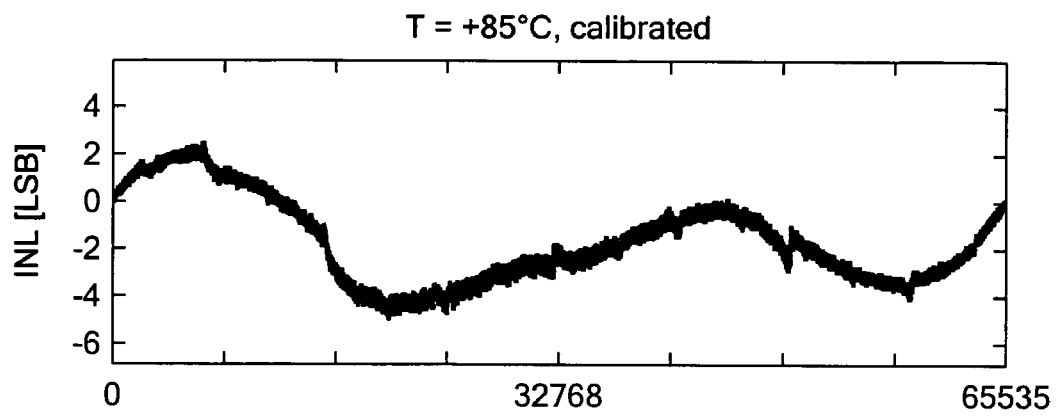
FIG. 4 is a graph showing measured INL (integral non-linearity) at 85° C. for an ADC system in accordance with the subject invention.
Figure 5:
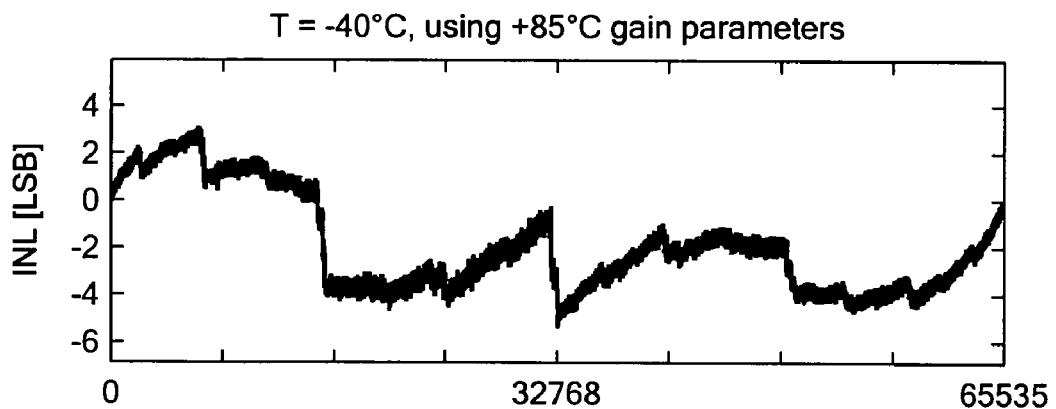
FIG. 5 is a graph showing the effect when calibration is disabled, the temperature is reduced to −40° C., and then the INL was measured for an ADC system in accordance with the subject invention.
Figure 6:
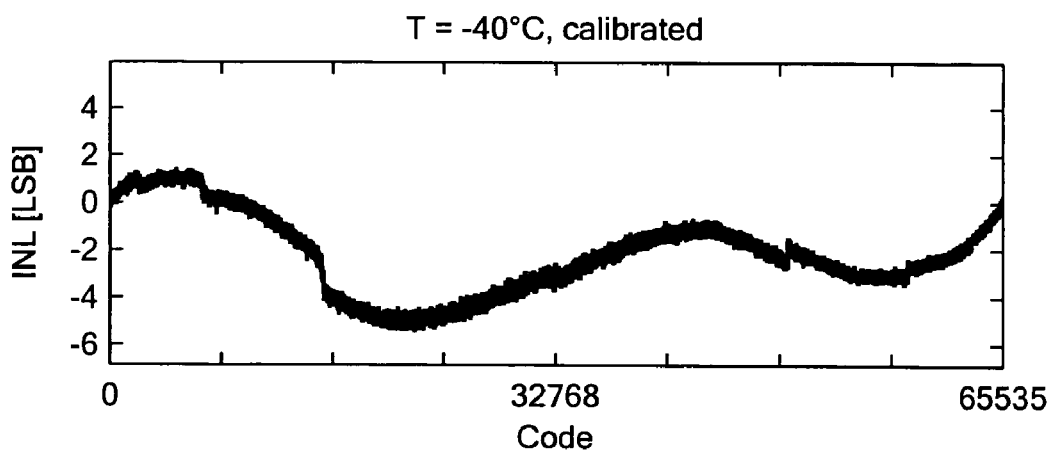
FIG. 6 is a graph showing the INL measurements after calibration was re-enabled at a temperature of −40° C.

Due to the reduced number of conversions required, the continuous background calibration means the ADC system of this invention can track out changes in calibration parameters caused by environmental changes such as temperature. This is shown in FIGS. 4-6. FIG. 4 shows measured INL at +85° C. For FIG. 5, calibration was disabled, temperature was reduced to −40° C., and then INL was measured. Without the background calibration operating, the 85° C. parameters are incorrect at −40° C. and the INL plot shows degraded linearity. For FIG. 6, calibration was re-enabled and after a convergence transient (similar to that shown in FIG. 3), the original INL performance is measured when the calibration coefficients have converged to the new values required for −40° C. It should be noted that the "time constant" of the calibration convergence is measured in conversions; thus the actual convergence time depends on the conversion rate at which the ADC system is operated. Although ADC performance was verified at 1 MSps, all measured plots were obtained at a conversion rate of 200 kS/s due to limitations in the prototype equipment when reading out both ADC output codes and calibration parameters simultaneously.

Figure 7:
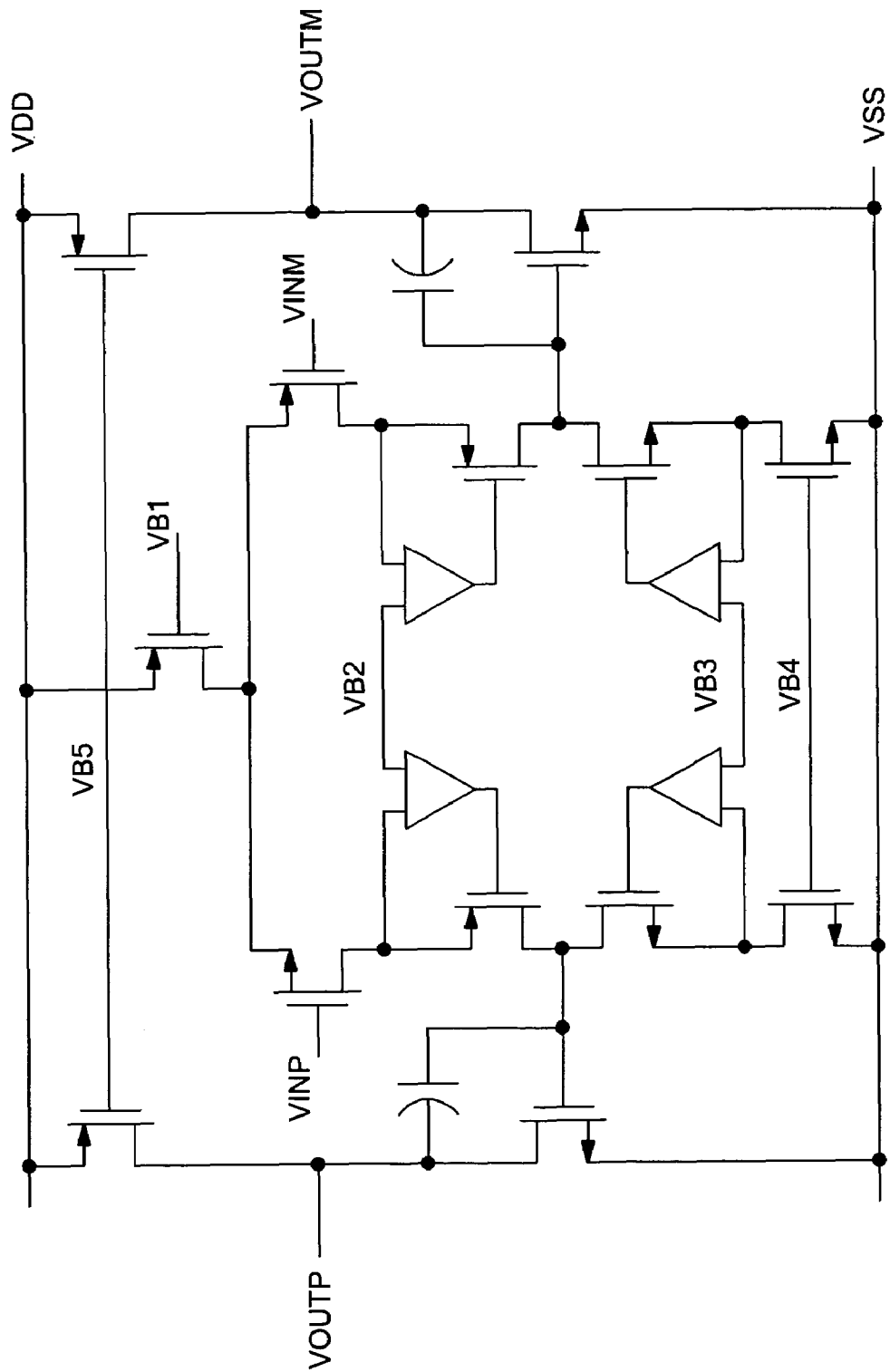
FIG. 7 is a schematic simplified view of an Op-Amp in accordance with the subject invention.

One implementation of the algorithmic ADC required a cyclic gain block with 16-bit linearity, implying an op-amp open-loop gain of >110 dB. The schematic of one op-amp design is shown in FIG. 7 at 30. To achieve sufficient open-loop gain, a two-stage architecture was used with gain-boosted cascodes in the first stage. No cascoding was used in the output stage due to headroom constraints in the 2.5V supply environment. The deep N-well capability of the process was exploited to tie substrate to source of the cascoding devices and thus overcome gain degradation due to reduced output impedance caused by impact ionization.

Figure 8:
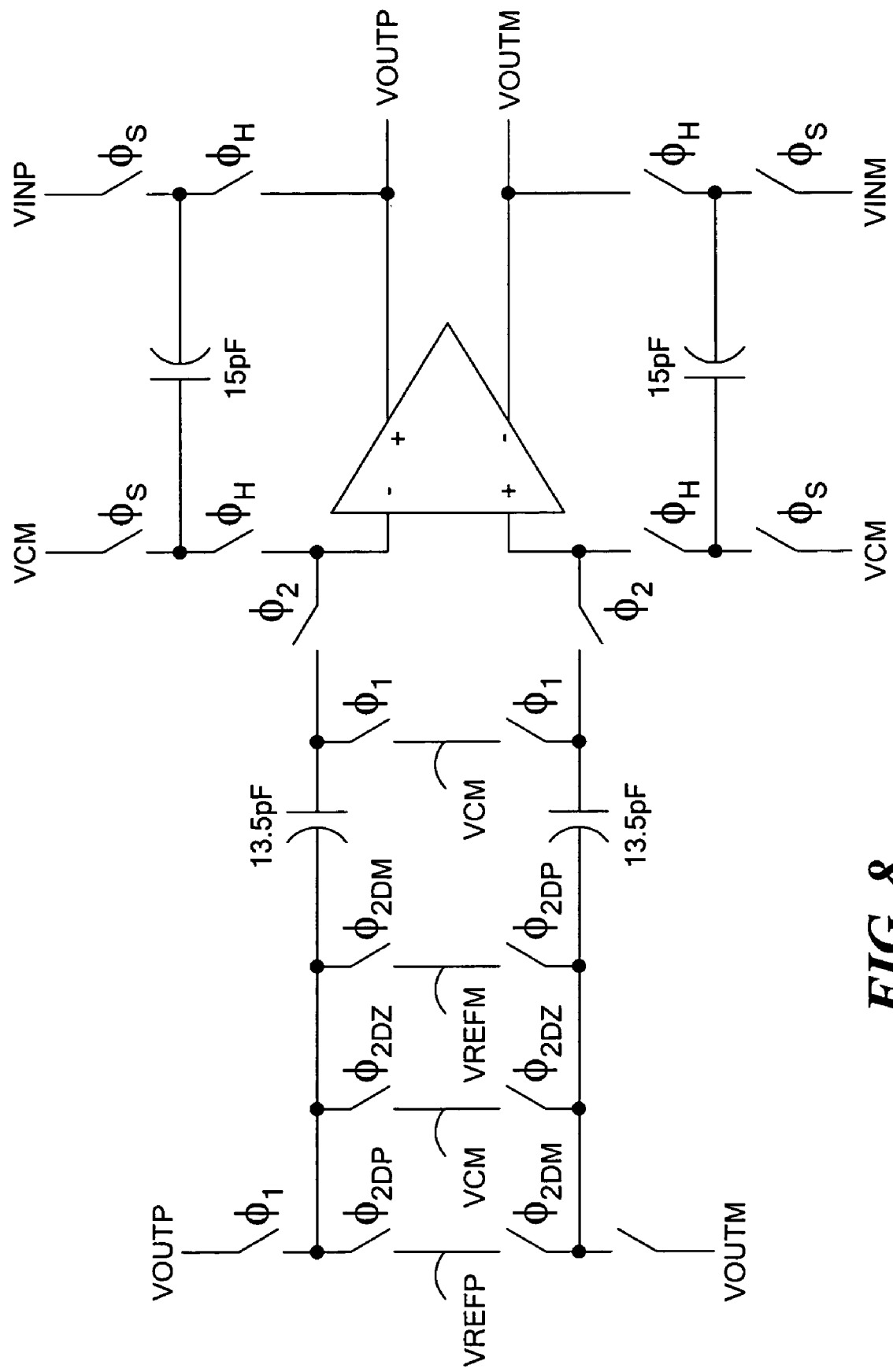
FIG. 8 is a more detailed schematic view of a sample and hold, 3-level digital to analog converter (DAC) in accordance with the subject invention.

The S/H, gain block, and DAC functions may be combined into the same switched capacitor circuit. A simplified schematic is shown in FIG. 8. The relatively large capacitances of 13.5 pF and 15 pF were necessary to achieve limited kT/c noise performance within the constraints of the cyclic architecture.

Figure 9:
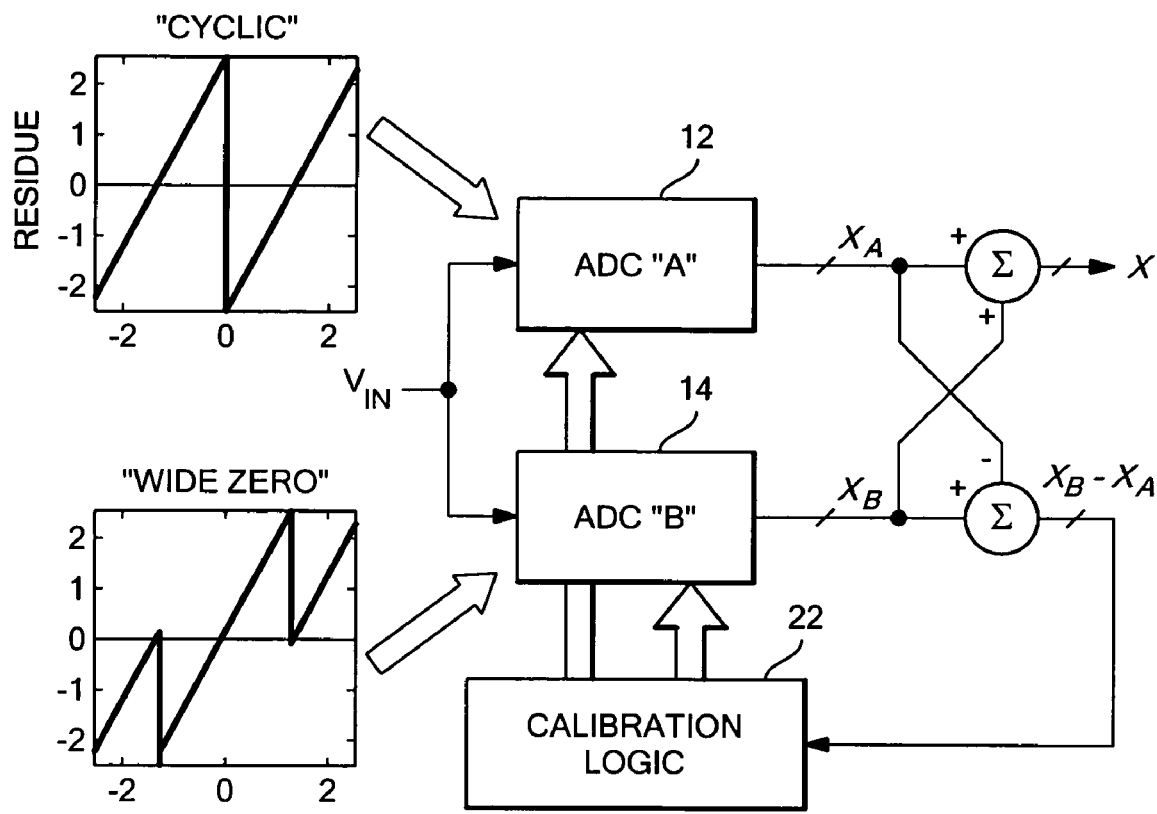
FIG. 9 is a another block diagram of the ADC system of the subject invention.
Figure 10:
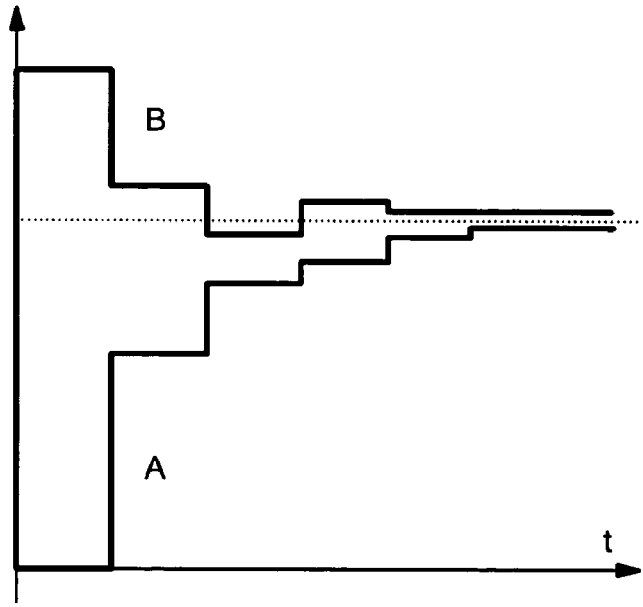
FIG. 10 is a graph showing conversions for the calibration of two ADCs shown in FIG. 9 when different paths are forced.

As stated above, although accurate calibration does imply agreement in the output codes, it is not necessarily true that agreement implies accurate calibration. To ensure that ΔX=0 implies correct calibration, it is necessary to force the two sides to take different decision paths to the final result of their conversions. A visual and possibly more intuitive expression of this concept is provided in FIGS. 9-10 which show the intermediate results of the conversion process for successive cyclic decisions within a single conversion. By setting converters 12 and 14 to different residue modes, the initial decision is "0" for ADC 12 and "1" for ADC 14. If correctly calibrated by calibration logic 22, both converters then proceed on different paths to the same correct final value indicated by the dashed line in FIG. 10. The only way for the converters to always agree, even if different residue modes are used, is for both converters to be correctly calibrated.

FIG. 2 also shows that the novel split ADC technique of this invention has negligible impact on analog complexity. The die area of an ADC designed to meet a given power, speed, and noise specification is considered in simplified fashion as $g_m$ block 40 representing the area of active analog circuitry such as amplifiers; a C block 42 representing the area of passive components such as capacitors and switches, and digital circuitry block 44. It is assumed that bandwidth fT is proportional to $g_m/C$; power P is proportional to $g_m$; and noise $\sigma_X$ is proportional to $\sqrt{kT/c}$. Proportionality constants b, p, and m are determined by the specific circuit design and are unchanged by the split architecture as shown at 12 and 14 which merely scales the design by ½. As shown by the equations in table 2, power, bandwidth, and overall noise are unchanged. The only penalty is a slight increase in complexity of the digital block, which is the preferred tradeoff in deep submicron CMOS.

TABLE 2

| Speed | $f_T = b\left(\dfrac{g_m}{C}\right)$ | $f_T = b\left(\dfrac{g_m/2}{C/2}\right) = b\left(\dfrac{g_m}{C}\right)$ |
|---|---|---|
| Power | $P = p \cdot g_m$ | $P = p \cdot \dfrac{g_m}{2} + p \cdot \dfrac{g_m}{2} = p \cdot g_m$ |
| Noise | $\sigma_x = n\sqrt{\dfrac{kT}{C}}$ | $\sigma_x = \sqrt{\left(\dfrac{1}{2}n\sqrt{\dfrac{kT}{C/2}}\right)^2 + \left(\dfrac{1}{2}n\sqrt{\dfrac{kT}{C/2}}\right)^2} = n\sqrt{\dfrac{kT}{C}}$ |

Consideration of ADC die area is simplified to blocks representing active analog circuitry such as amplifiers ($g_m$) 50; passives such as capacitors and switches (C) 52, and digital circuitry 54. Proportionality constants b, p, and m are determined by the specific circuit, and are unchanged by the split which scales the design by ½. Briefly, it turns out that by splitting the original ADC analog side, there are two channels each with noise increased by √2. Averaging logic 18, FIG. 1 averages the two outputs so that the noise is reduced by a factor of √2 at the output 20, so the overall SNR is the same.

For the single ADC layout floorplan, assume that noise is kT/C limited, $$\sigma_x = n\sqrt{\dfrac{kT}{C}}, \tag{6}$$

bandwidth is proportional to $g_m/C$, $$f_T = b\left(\dfrac{g_m}{C}\right) \tag{7}$$

and power dissipation is proportional to $g_m$:

$$P = p \cdot g_m. \tag{8}$$

The proportionality constants n, b, and p depend on details of the circuit implementation. When the ADC is "split" as shown in FIGS. 1-2 it is possible to share the majority of the digital functionality. Thus, the increase in digital area and power consumption is modest.

For the noise of each channel, using the kT/C proportionality the equation above, $$\sigma_{xA} = \sigma_{xB} = n\sqrt{\dfrac{kT}{C/2}}. \tag{9}$$

Using the rules for standard deviation of a function of random variables, the total noise is given by $$x = \frac{x_A + x_B}{2} \Rightarrow \sigma_x = \frac{1}{2}\sqrt{\sigma_{xA}^2 + \sigma_{xB}^2} . \qquad (10)$$

Substituting equation 10 with equation 9 yields:

$$\sigma_x = n\sqrt{\frac{kT}{C}} \qquad (11)$$

which shows that the total noise is unchanged from the original noise for the ADC before splitting.

For bandwidth, substituting the "split" values into equation (7) gives:

$$f_T = b\left(\frac{g_m/2}{C/2}\right) = b\left(\frac{g_m}{C}\right) \qquad (12)$$

which shows that bandwidth in each channel is unchanged.

For total power, substituting the "split" values into equation (8) yields:

$$P = \underbrace{p \cdot \frac{g_m}{2}}_{A} + \underbrace{p \cdot \frac{g_m}{2}}_{B} = p \cdot g_m \qquad (13)$$

which shows that the total analog power is unchanged.

In summary, splitting the single ADC into dual channels leaves noise and bandwidth unchanged, as well as die area and power requirements for the analog circuitry. There is only a modest increase in requirements for digital power and die area. One key advantage of the split/dual channel architecture is that if both channels are correctly calibrated, their output codes should agree, and if they do not agree, the pattern of disagreement yields information for correcting the calibration. It turns out that the more "different" the two channels' paths or sequence of decisions to their respective output codes, the more information is provided. One means by which the ADCs are sent on their different paths is the multiple residue cyclic amplifier is described infra.

Figure 11:
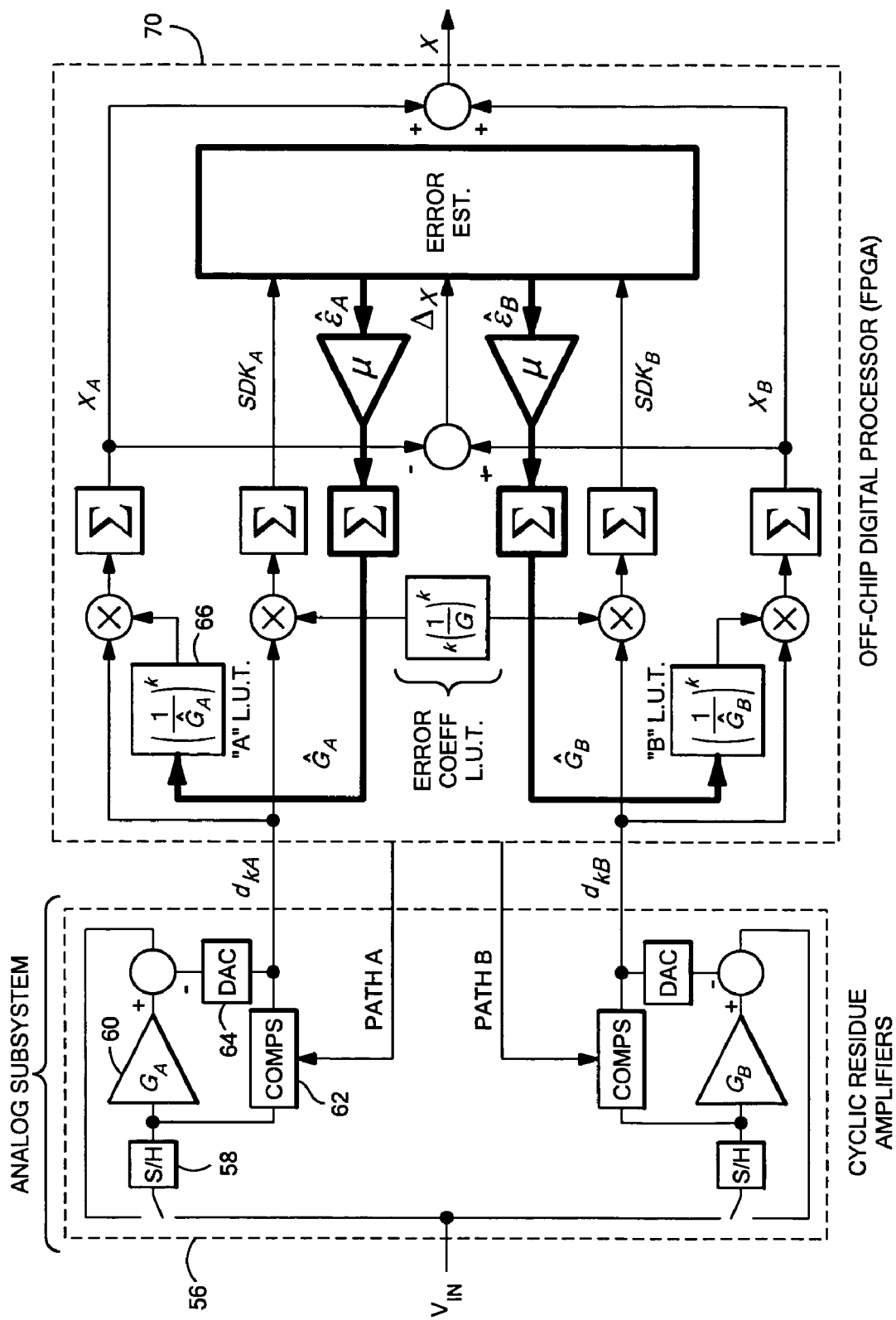
FIG. 11 is a block diagram depicting a prototype implementation of the ADC system of the subject invention including two cyclic ADCs.

For one implementation of the split ADC concept, an algorithmic (cyclic) converter was chosen as shown in FIG. 11 since the only parameter needed to calibrate ADC linearity is the gain of the residue amplifier. The analog portion 56 of each ADC consists of S/H 58, a 16-bit-linear gain block 60 (nominal gains $G_A = G_B = 1.92$), comparators 62, and a three-level DAC 64. To achieve 16-bit linear operation, a two-stage op-amp with gain-boosted cascading of the first stage was used. Fully differential techniques were used with a standard SC implementation of the S/H, DAC, and gain stage. The output of the analog subsystem is a three-level (−1/0/+1) decision for each cycle of the conversion process. For each side of the split architecture, digital outputs $X_A$ and $X_B$ are accumulated from the comparator decisions using L.U.T. 66 containing the cycle decision weights, which are calculated from the gain estimates $\hat{G}_A$ and $\hat{G}_B$.

The background calibration process shown by the thick lines in FIG. 11 operates continuously in the digital domain so that $\hat{G}_A$, $\hat{G}_B$ and their associated L.U.T.s are correct to within converter accuracy. The process begins with $\hat{\epsilon}_A$ and $\hat{\epsilon}_B$, which are continuously updated zero-bias estimates of the error in the estimated gains $\hat{G}_A$ and $\hat{G}_B$. Estimates $\hat{\epsilon}_A$ and $\hat{\epsilon}_B$ are used in an LMS procedure to update $\hat{G}_A$ and $\hat{G}_B$. As these are periodically updated, the decision weight L.U.T.s are recalculated. The LMS coefficient μ was chosen for a time constant of approximately 2,000 conversions for the calibration adaptation. Convergence from typical initial error is completed within approximately 10,000 conversions.

Figure 12:
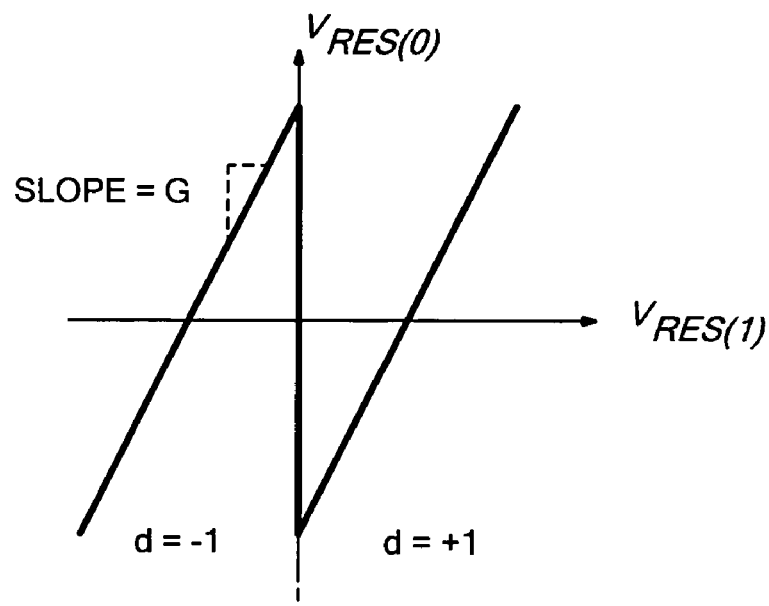
FIG. 12 is a plot of an voltage transfer characteristic relating a residue amplifier output voltage $V_{RES(O)}$ and the corresponding residue amplifier input voltage $V_{RES(i)}$.

For the implementation of the split ADC concept described here, an algorithmic (or cyclic) converter was chosen since the only parameter needed to calibrate ADC linearity is the gain of the residue amplifier. To show how the residue amplifier gain is involved in the calibration process, we now consider the example of a conventional cyclic ADC shown in FIG. 13. At the start of the conversion the S/H switch is in the input position. The cyclic converter samples the input, compares it to a threshold, then applies the cyclic gain G and adds or subtracts a reference depending on the comparator decision. The input-to-residue-output characteristic implemented is shown in FIG. 12. In the first cycle, the input $v_{IN}$ is mapped to a residue $v_{RES(1)}$ by:

$$v_{IN} \Rightarrow \underbrace{G(v_{IN}) - d_1(V_{REF})}_{RESIDUE} = v_{RES(1)} \qquad (14)$$

For all following cycles, the S/H input is switched to the residue amplifier output. For the second cycle, the first cycle residue $v_{RES(1)}$ is the input, so by the same process $V_{RES(2)}$ is:

$$v_{RES(2)} = G\underbrace{[G(v_{IN}) - d_1(V_{REF})]}_{v_{RES(1)}} - d_2(V_{REF}) \qquad (15)$$

And for the third cycle:

$$v_{RES(3)} = G\underbrace{\{G[G(v_{IN}) - d_1(V_{REF})] - d_2(V_{REF})\}}_{v_{RES(2)}} - d_3(V_{REF}) \qquad (16)$$

Pausing here to rearrange, we obtain:

$$v_{RES(3)} = G^3(v_{IN}) - [G^2 d_1 + G^1 d_2 + G^0 d_3](V_{REF}) \qquad (17)$$

Rearranging gives:

$$\frac{v_{IN}}{V_{REF}} = \frac{1}{G}d_1 + \frac{1}{G^2}d_2 + \frac{1}{G^3}d_3 - \frac{1}{G^3}\frac{v_{RES(3)}}{V_{REF}} \qquad (18)$$

The quantity $v_{IN}/V_{REF}$ is just what we want for the output code of an ADC. In the general case of N cycles, the converter provides a sequence of N decisions $d_k$ which satisfy $$\frac{v_{IN}}{V_{REF}} = \underbrace{\sum_{k=1}^{N}\left(\frac{1}{G}\right)^k d_k}_{\text{OUTPUT CODE } x} - \underbrace{\frac{1}{G^N}\frac{v_{RES(N)}}{V_{REF}}}_{\text{QUANTIZATION ERROR}} \qquad (19)$$

Of the two terms on the right side of (19), the first term represents the ideal output code x of the ADC which is determined from the comparator decisions $d_k$. Digital calibration and correction is implemented by estimating the cyclic gain G to the converter accuracy, calculating the powers of 1/G for use as decision weights in a lookup table, and accumulating the output code x as the decisions $d_k$ become available in the cyclic conversion process. To provide margin for errors such as comparator offset and noise a gain G<2 was chosen.

The second term in (19) from the last (Nth) residue corresponds to the quantization noise of the ADC. Choosing G<2 implies that N cycles will provide fewer than N bits of resolution; the second term in (19) can be used to determine how many cycles are required to achieve a desired resolution. In [1, 2] a cyclic gain of G≈1.92 was used, which according to (19) would require 18 cycles to achieve 16-bit-resolution. In the actual implementation, two extra cycles were added for a total of N=20 to reduce the effect of quantization noise on the error estimation process.

Split ADC Implementation

A simplified system block diagram of the split ADC implementation is shown in FIG. 11. The analog portion of each cyclic ADC consists of a S/H, a 16-bit-linear gain block (nominal gains $G_A=G_B=1.92$), comparators, and a three-level DAC. The output of the analog subsystem is a three-level (−1/0/+1) decision for each cycle of the conversion process. For each side of the split, digital outputs $x_A$ and $x_B$ are accumulated from the comparator decisions using a lookup table (L.U.T.) containing the cycle decision weights, which are calculated from the gain estimates $\hat{G}_A$ and $\hat{G}_B$.

The calibration process, indicated by the thick line in FIG. 11, operates in the digital domain so that $\hat{G}_A$, $\hat{G}_B$ and their associated L.U.T.s are correct to within converter accuracy. It should be emphasized that this process operates continuously and in the background; foreground conversion of the input signal is not interrupted.

LMS Calibration Loop

To consider the operation of the LMS calibration loop, we first define $\epsilon_A$ and $\epsilon_B$ as the fractional error in estimates $\hat{G}_A$ and $\hat{G}_B$ relative to the true analog gains $G_A$ and $G_B$:

$$\hat{G}_A = G_A(1+\epsilon_A) \quad \hat{G}_B = G_B(1+\epsilon_B) \tag{20}$$

The error estimation process described below provides continuously updated zero-bias estimates $\hat{\epsilon}_A$ and $\hat{\epsilon}_B$ of the error in the estimated gains $\hat{G}_A$ and $\hat{G}_B$. Estimates $\hat{\epsilon}_A$ and $\hat{\epsilon}_B$ are used in a negative feedback LMS procedure, shown in the thick gray line in FIG. 11, to update $\hat{G}_A$ and $\hat{G}_B$:

$$\hat{G}_A^{(new)} = \hat{G}_A^{(old)} - \mu_G \hat{\epsilon}_A \tag{21a}$$

$$\hat{G}_B^{(new)} = \hat{G}_B^{(old)} - \mu_G \hat{\epsilon}_B \tag{21b}$$

As the $\hat{G}_A$ and $\hat{G}_B$ are periodically updated, the decision weight L.U.T. is recalculated. Equilibrium is reached at the correct $G_A$ and $G_B$ values when the estimated errors $\hat{\epsilon}_A$ and $\hat{\epsilon}_B$ reach zero (on average). The LMS coefficient $\mu_G$ controls the time constant of the calibration adaptation. A value of $\mu_G=1/1024$ was chosen as a compromise in the tradeoff between accuracy and speed of adaptation. Note an advantage of the LMS technique: the estimates $\hat{\epsilon}_A$ and $\hat{\epsilon}_B$ need not be accurate, as long as they are zero-bias and (on average) point the convergence of (21) in the right direction. The general LMS technique is well established; the novel contribution of this work is how the split ADC enables the techniques used in the error estimation process described in the following sections.

Error Estimation Process

To simplify the development of the error estimation theory, we will temporarily ignore offset and scale factor mismatches between the A and B ADCs. The effect of these errors will be discussed later.

For each side of the split, digital outputs $x_A$ and $x_B$ are accumulated from the comparator decisions using $$x_A = \sum_{k=1}^{N} \left(\frac{1}{\hat{G}_A}\right)^k d_{kA} \tag{22a}$$

$$x_B = \sum_{k=1}^{N} \left(\frac{1}{\hat{G}_B}\right)^k d_{kB} \tag{22b}$$

in which $d_k$ is the comparator decision in the kth cycle, and the required decision weights are stored in a lookup table calculated from powers of the gain estimates $\hat{G}_A$ and $\hat{G}_B$. To consider the effect of errors in $\hat{G}_A$ and $\hat{G}_B$, suppose the estimates in (22) are in error as defined in (20). Substituting (20) into (22) and approximating $1/(1+\epsilon)^k \approx 1-k\epsilon$ gives $$x_A = \underbrace{\sum_{k=1}^{N}\left(\frac{1}{G_A}\right)^k d_{kA}}_{\text{CORRECT } x} - \epsilon_A \underbrace{\sum_{k=1}^{N} k\left(\frac{1}{G_A}\right)^k d_{kA}}_{\text{"A" ERROR}} = x - \epsilon_A[SDK_A] \tag{23a}$$

$$x_B = \underbrace{\sum_{k=1}^{N}\left(\frac{1}{G_B}\right)^k d_{kB}}_{\text{CORRECT } x} - \epsilon_B \underbrace{\sum_{k=1}^{N} k\left(\frac{1}{G_B}\right)^k d_{kB}}_{\text{"B" ERROR}} = x - \epsilon_B[SDK_B] \tag{23b}$$

The expressions for the actual ADC output codes each consist of two terms. Comparing with (19) shows that the first term (indicated with "CORRECT x") corresponds to the correct output code. Since both ADCs are converting the same analog input, these must be equal (to within quantization error) even if the decision trajectories $d_{kA}$ and $d_{kB}$ are different. The second term corresponds to the errors in the "A" and "B" output codes. Note that the error is simply proportional to $\epsilon_A$ and $\epsilon_B$, the fractional error in the gain estimates $\hat{G}_A$ and $\hat{G}_B$. The proportionality terms, designated as error coefficients $SDK_A$ and $SDK_B$, are determined by the decision trajectories $d_{kA}$ and $d_{kB}$, and weighting terms $k(1/G)^k$. As shown in FIG. 11, the $SDK_A$ and $SDK_B$ values are accumulated during each conversion using the comparator decisions and a separate error coefficient lookup table. Note that, since the errors $\epsilon_A$ and $\epsilon_B$ are ultimately forced to zero by the calibration loop, the accuracy requirements for $SDK_A$ and $SDK_B$ in the error estimation process are not as stringent as for the $x_A$ and $x_B$ code L.U.T.s. Thus a single lookup table stored in ROM is used with values precalculated using the nominal gain G=1.92.

When the two output codes are averaged to obtain the overall ADC output code, the result is $$\frac{x_A + x_B}{2} = x - \frac{\epsilon_A[SDK_A]}{2} - \frac{\epsilon_B[SDK_B]}{2} \tag{24}$$

So if the errors $\epsilon_A$ and $\epsilon_B$ can be driven sufficiently close to zero, the overall ADC output code will be the correct value x.

When we subtract to get the difference $\Delta x$ the "CORRECT x" terms cancel and the result is $$\Delta x = x_B - x_A = \epsilon_A[SDKA] + \epsilon_B[-SDKB] \tag{25}$$

Thus the difference $\Delta x$ depends only on the estimate errors $\epsilon_A$ and $\epsilon_B$ with error coefficients $SDK_A$ and $SDK_B$.

In principle we could solve a 2×2 matrix equation using $\Delta x$, $SDK_A$, and $SDK_B$ values from two conversions to estimate $\epsilon_A$ and $\epsilon_B$. This is indicated in the equation below in which the "1" and "2" subscripts indicate values from two different ADC conversions:

$$\Delta x_1 = \epsilon_A[SDKA_1] + \epsilon_B[-SDKB_1] \Rightarrow \tag{26}$$
$$\Delta x_2 = \epsilon_A[SDKA_2] + \epsilon_B[-SDKB_2]$$

$$\begin{bmatrix} \Delta x_1 \\ \Delta x_2 \end{bmatrix} = \begin{bmatrix} SDKA_1 & -SDKB_1 \\ SDKA_2 & -SDKB_2 \end{bmatrix} \begin{bmatrix} \epsilon_A \\ \epsilon_B \end{bmatrix}$$

Figure 13:
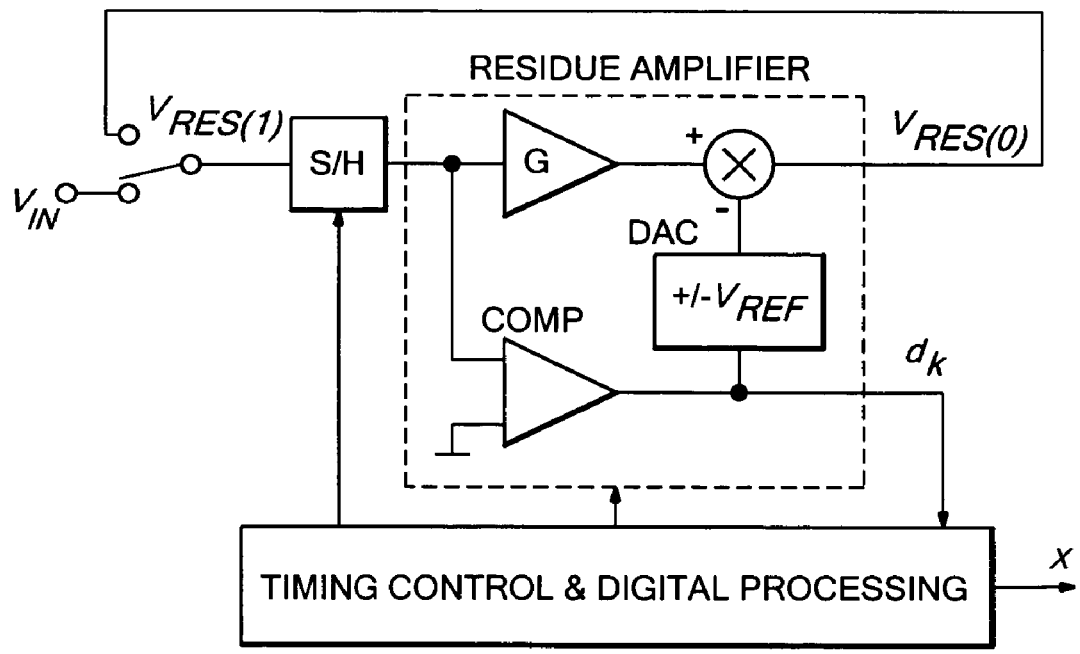
FIG. 13 is a schematic view of a residue amplifier with the characteristic as shown in FIG. 12.
Figure 14:
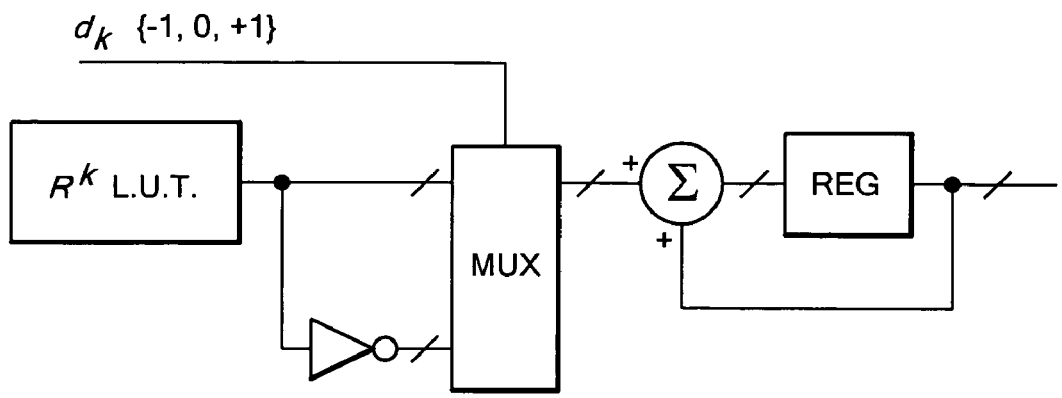
FIG. 14 is a schematic view of digital circuitry which implements digital correction of a sequence of K digital decisions $d_K$ with weights $R^K$ determined by digital calibration.
Figure 15:
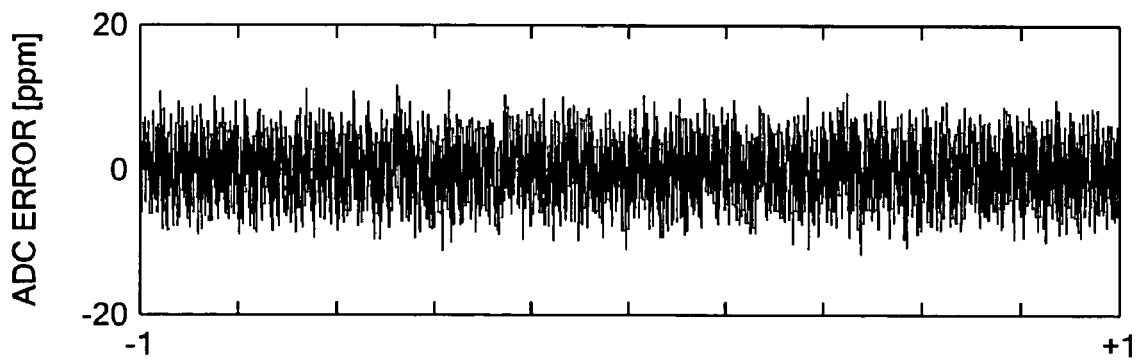
FIG. 15 is a plot of ADC error as a function of output code when the ADC is correctly calibrated.
Figure 16:
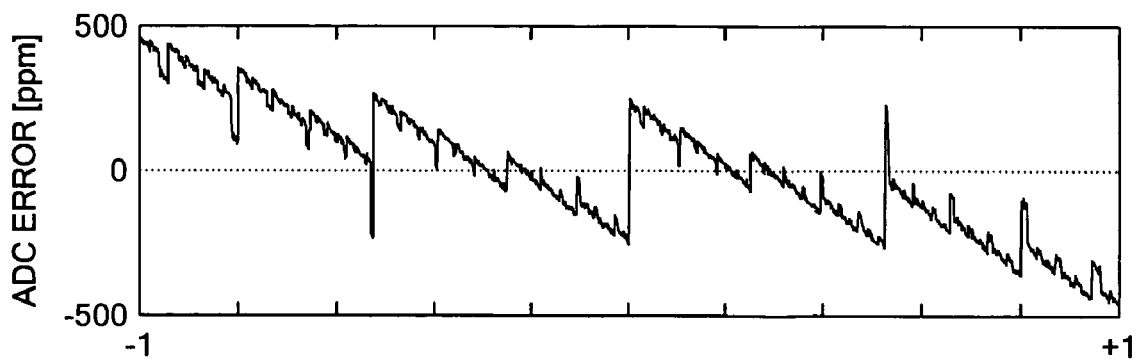
FIG. 16 is a plot of ADC error when calibration parameters are in error by 0.1%.
Figure 17:
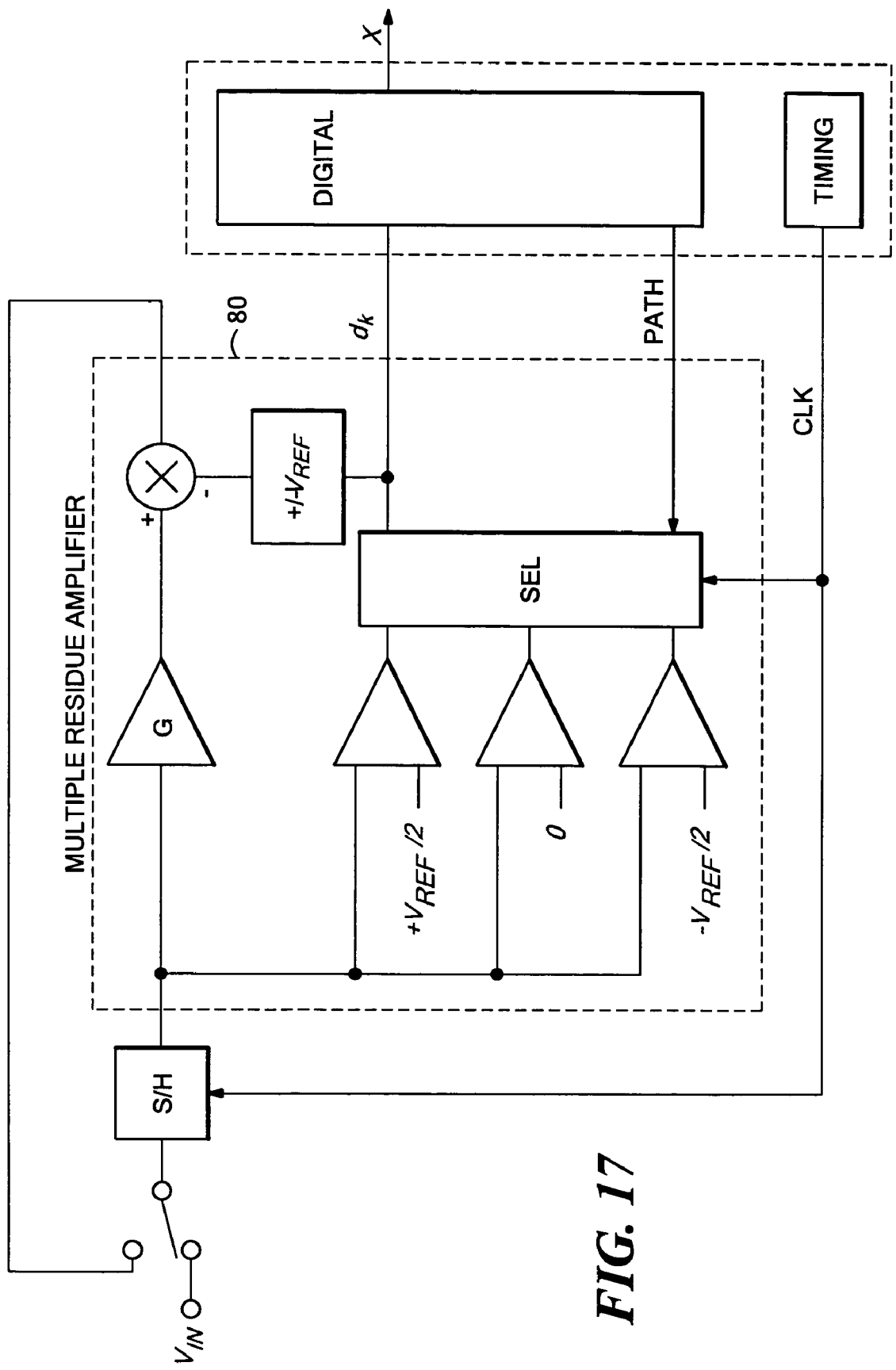
FIG. 17 is a simplified block diagram of a cyclic ADC using a multiple residue mode cyclic amplifier.
Figure 18:
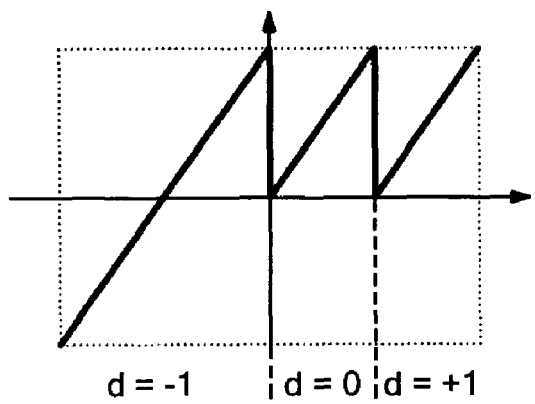
FIGS. 18-21 are residue plots of possible modes of the cyclic ADC of FIG. 17.
Figure 19:
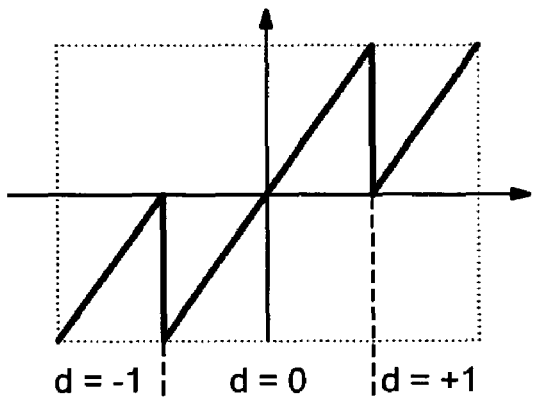
Figure 20:
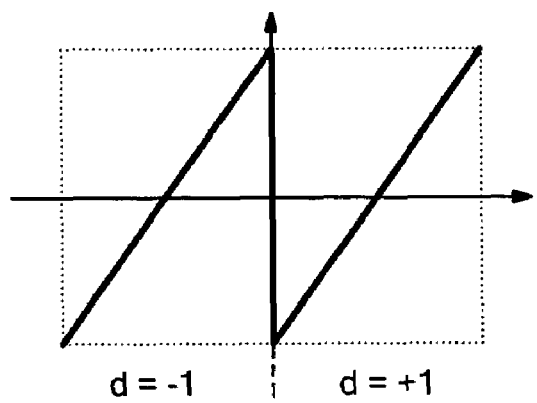
Figure 21:
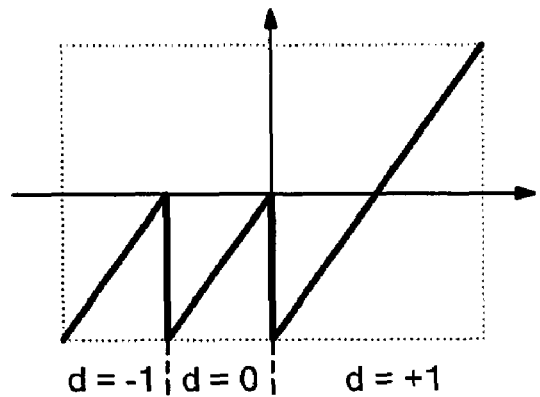
Figure 22:
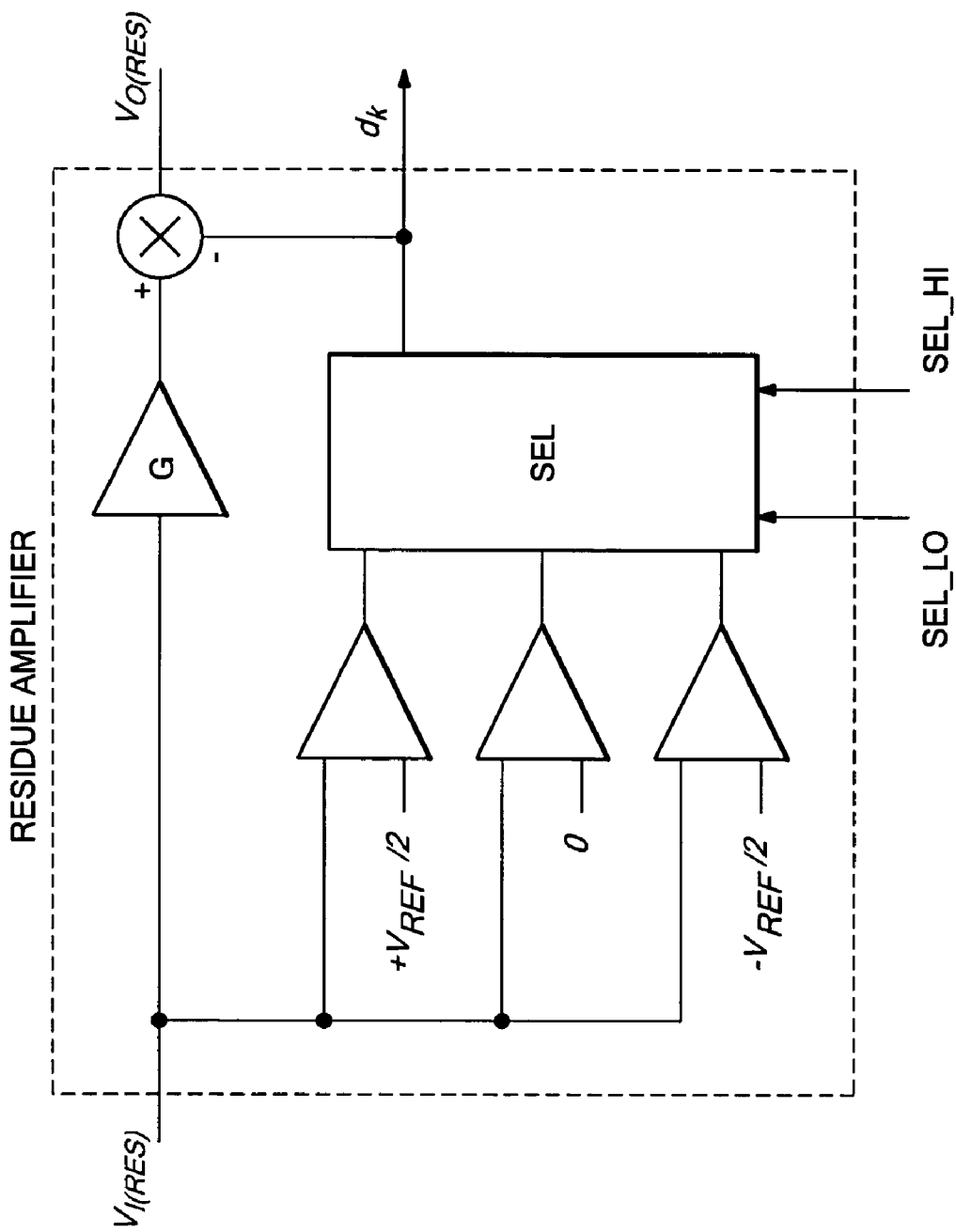
FIG. 22 is simplified block diagram of the multiple residue mode cyclic amplifier of FIG. 17, showing digital inputs SEL_LO and SEL_H1 used to select among the four possible residue modes.
Figure 23:
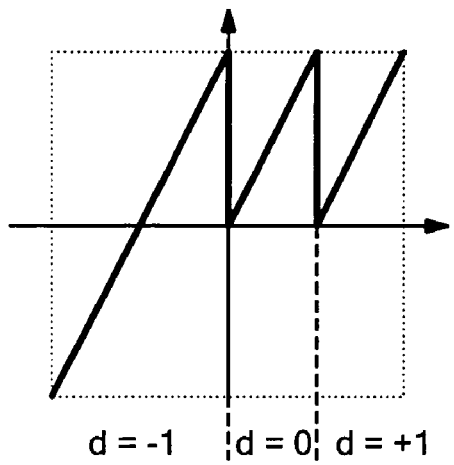
FIGS. 23-26 are residue plots of possible modes of the multiple residue mode amplifier of FIG. 22.
Figure 24:
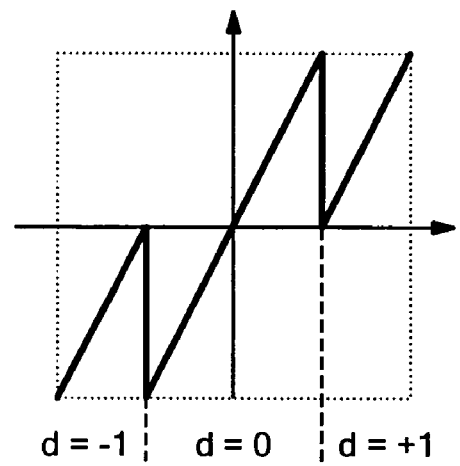
Figure 25:
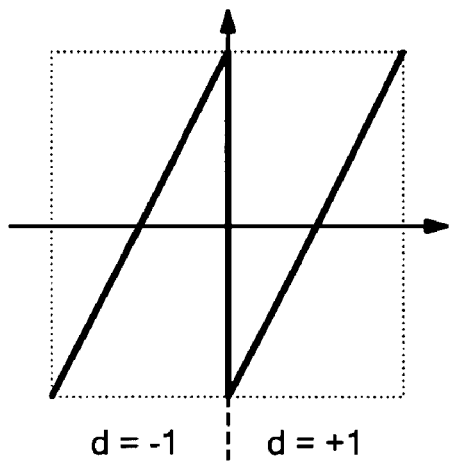
Figure 26:
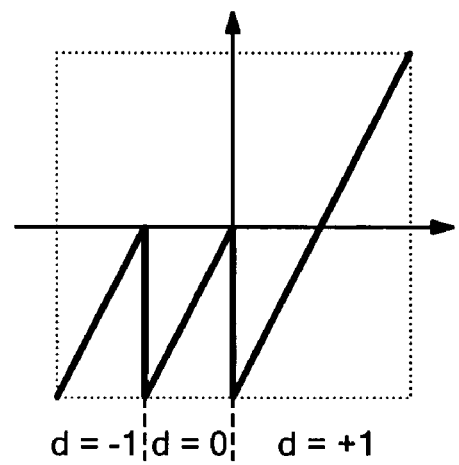

A difficulty in using this approach with the simple cyclic ADC of FIG. 13 is that the decision paths $d_{kA}$ and $d_{kB}$ (and therefore the coefficients $SDK_A$ and $SDK_B$) are determined entirely by the input signal. In the case of a DC input, the coefficients $SDK_A$ and $SDK_B$ are unchanged from conversion 1 to 2, the 2×2 matrix is singular, and no information about $\epsilon_A$ and $\epsilon_B$ can be determined.

To avoid matrix singularity, the coefficients $SDK_A$ and $SDK_B$ must be varied on a conversion-to-conversion basis. This is achieved by varying the decision trajectories using a multiple residue mode amplifier. The redundancy enabled by choosing G<2 allows multiple valid decision sequences corresponding to a given input. The digital control of residue mode afforded by the multiple residue mode amplifier allows a choice of different residue modes for the A and B converters, as well as variation of residue mode on a conversion-to-conversion basis. By varying residue modes it is possible to force different decision paths $d_{kA}$ and $d_{kB}$. FIGS. 27-34 shows the four possible residue modes, as well as a plot of the resulting SDK coefficients over the range of ADC decision trajectories.

The result is sufficient variation of the $SDK_A$ and $SDK_B$ coefficients that the matrix in (26) is nonsingular, even in the case of a DC input. Therefore a "busy" input is not required to extract calibration information about $\epsilon_A$ and $\epsilon_B$. Intuitively, if $SDK_A$ and $SDK_B$ are varied in a somewhat independent fashion, then the only way for $\Delta x$ to always be zero is for $\epsilon_A$ and $\epsilon_B$ to both be zero. The only pathological input condition that presents a difficulty is a DC input at + or – full scale, which despite redundancy results in a nearly identical sequence of decisions regardless of the residue mode. Although calibration cannot proceed reliably during this input condition, the condition can be identified and calibration suspended to avoid corruption of calibration parameters.

In practice, the simple approach embodied in (26) requires modifications.

In the presence of offset and scale factor errors in the A and B converters, there will be systematic variations in the $\Delta x$ values which are not related to the true values of $\epsilon_A$ and $\epsilon_B$. To separate out these effects requires information from additional conversions and modification of the matrix equation, as described below.

In the presence of noise in the A and B conversions, there will be additional random noise in the $\Delta x$ values which are not related to the true values of $\epsilon_A$ and $\epsilon_B$. Therefore the results of solving the matrix equation should be considered as estimates $\hat{\epsilon}_A$ and $\hat{\epsilon}_B$.

To simplify digital hardware, matrix inversion is avoided; rather an iterative matrix approximation procedure is used to develop the estimates $\hat{\epsilon}_A$ and $\hat{\epsilon}_B$. The procedure is folded into the iterative nature of the LMS algorithm described previously. Dealing with the matrix in this way has two advantages: the digital complexity of matrix inversion is avoided, and the effects of random noise are effectively averaged out over the time constant of the LMS adaptation.

The matrix approximation procedure, which is tolerant of offset and scale factor errors, is described below.

Effect of Offset, Scale Factor Errors

The previous analysis ignores offset errors in each of the A and B channels, as well as the possibility of a scale factor gain error between channels. To model these effects, terms representing output-referred offset and scale factor errors can be introduced into (23a) and (23b) as follows:

$$x_A = (1+g_A)x + x_{OSA} \epsilon_A[SDKA] \tag{27a}$$

$$x_B = (1+g_B)x + x_{OSB} - \epsilon_B[SDKB] \tag{27b}$$

Before considering how offset and scale factor errors affect the $\Delta x$ difference and calibration procedure, we examine their effect on the overall ADC output code. Taking the average of (27a) and (27b) gives $$\frac{x_A + x_B}{2} = x\left(1 + \frac{g_A + g_B}{2}\right) + \frac{x_{OSA} + x_{OSB}}{2} - \frac{\epsilon_A[SDKA]}{2} - \frac{\epsilon_B[SDKB]}{2} \tag{28}$$

For the ADC implementation described here, the effects of offset and scale factor errors cannot be removed unless additional analog complexity is added. In many applications this is not necessary; many end users can tolerate offset and gain errors as long as ADC linearity is maintained. For applications which require absolute accuracy, end users must provide absolute calibration, for example by taking the ADC off line to apply zero and reference voltage inputs.

Since the overall ADC reports an output including the average of offset and scale factor errors, we define a new "correct x" including these effects:

$$x' = x\left(1 + \frac{g_A + g_B}{2}\right) + \frac{x_{OSA} + x_{OSB}}{2} \tag{29}$$

With this definition, and defining $$g = g_B - g_A \tag{30}$$

$$x_{OS} = x_{OSB} - x_{OSA} \tag{31}$$

It can be shown that, assuming second order terms negligible, (14a) and (14b) can be expressed as:

$$x_A = x' - \left(\frac{g}{2}\right)x - \frac{x_{OS}}{2} - \epsilon_A[SDKA] \tag{32a}$$

$$x_B = x' + \left(\frac{g}{2}\right)x + \frac{x_{OS}}{2} - \epsilon_B[SDKB] \tag{32b}$$

Note from (29) that we do not necessarily need to estimate or correct the errors $x_{OS}$ and g: averaging (32a) and (32b) in accordance with the split ADC principle gives $$\frac{x_A + x_B}{2} = x' - \frac{\varepsilon_A [SDK_A]}{2} - \frac{\varepsilon_B [SDK_B]}{2} \quad (33)$$

So if the errors $\varepsilon_A$ and $\varepsilon_B$ can be driven sufficiently close to zero, the overall ADC output code will be the new "correct" x' since the definition of x' includes the effects of nonzero offset and scale factor.

However, when we subtract to get the difference $\Delta x$ for calibration purposes, the result is $$\Delta x = x_B - x_A = \varepsilon_A [SDKA] + \varepsilon_B [-SDKB] + x_{OS} + (g)x \quad (34)$$

The difference $\Delta x$ is influenced by the offset and scale factor errors, and no longer depends only on the estimate errors $\varepsilon_A$ and $\varepsilon_B$. Thus the presence of offset and scale factor errors pose a challenge for this calibration procedure. The fundamental principle of the "split ADC" approach is that the difference $\Delta x$ is zero when both ADCs are correctly calibrated. However, as seen from (34), in the presence of offset and scale factor errors, the difference $\Delta x$ will be nonzero even if the ADCs are correctly calibrated with $\varepsilon_A = 0$ and $\varepsilon_B = 0$. If offset and scale factor errors are not somehow taken into account, the ADC will fail to converge to correct cyclic gain estimates $G_A$ and $G_B$; rather, in trying to drive $\Delta x$ to zero the calibration loops incorrectly attempt to compensate for offset and scale factor errors by adjusting the cyclic gain estimates, which results in ADC nonlinearity.

If we were able to estimate the gain error g and offset error $x_{OS}$, then we could correct $x_A$ and $x_B$ as follows:

$$x_A = x' - \left(\frac{\hat{g}}{2}\right)x - \frac{\hat{x}_{OS}}{2} - \varepsilon_A [SDKA] + \underbrace{\left(\frac{\hat{g}}{2}\right)x + \frac{\hat{x}_{OS}}{2}}_{\text{CORRECTION}} \quad (35a)$$

$$x_B = x' + \left(\frac{\hat{g}}{2}\right)x + \frac{\hat{x}_{OS}}{2} - \varepsilon_B [SDKB] - \underbrace{\left(\frac{\hat{g}}{2}\right)x - \frac{\hat{x}_{OS}}{2}}_{\text{CORRECTION}} \quad (35b)$$

where $\hat{x}_{OS}$ and $\hat{g}$ are the estimated offset and scale factor errors. Define errors in these estimates as $$\varepsilon_g = \hat{g} - g \quad (36a)$$

$$\varepsilon_{OS} = \hat{x}_{OS} - x_{OS} \quad (36b)$$

Taking the difference of (35a) and (35b), and substituting (36a) and (36b), gives:

$$\Delta x = x_B - x_A = [-1]\varepsilon_{OS} + [-x]\varepsilon_g + [SDKA]\varepsilon_A + [-SDKB]\varepsilon_B \quad (37)$$

Note from (33) that we actually do not necessarily need to estimate or correct the errors $x_{OS}$ and g, since the definition of x' includes the effects of nonzero offset and scale factor. We only need to make the estimation of the cyclic gain errors $\varepsilon_A$ and $\varepsilon_B$ insensitive to $x_{OS}$ and g. In the procedure described below, scale factor error is estimated and corrected, and $\varepsilon_g$ driven to zero; offset is not estimated but the effect of nonzero offset is removed from the estimation process.

To see how this can be done, consider expanding the set of conversions used in the matrix definition in (26) to six conversions, using the expression in (37):

$$\begin{bmatrix} \Delta x_1 \\ \Delta x_2 \\ \Delta x_3 \\ \Delta x_4 \\ \Delta x_5 \\ \Delta x_6 \end{bmatrix} = \begin{bmatrix} -1 & -x_1 & SDKA_1 & -SDKB_1 \\ -1 & -x_2 & SDKA_2 & -SDKB_2 \\ -1 & -x_3 & SDKA_3 & -SDKB_3 \\ -1 & -x_4 & SDKA_4 & -SDKB_4 \\ -1 & -x_5 & SDKA_5 & -SDKB_5 \\ -1 & -x_6 & SDKA_6 & -SDKB_6 \end{bmatrix} \begin{bmatrix} \varepsilon_{OS} \\ \varepsilon_g \\ \varepsilon_A \\ \varepsilon_B \end{bmatrix} \quad (38)$$

The effect of offsets can be eliminated by using a "difference of differences" approach, subtracting row 2 from 1, 4 from 3, and 6 from 5. This cancels a constant offset from the calibration signal path; in reality the offset need only be constant over the time scale of the six conversions. The result is $$\begin{bmatrix} \Delta x_1 - \Delta x_2 \\ \Delta x_3 - \Delta x_4 \\ \Delta x_5 - \Delta x_6 \end{bmatrix} = \begin{bmatrix} x_2 - x_1 & SDKA_1 - SDKA_2 & SDKB_2 - SDKB_1 \\ x_4 - x_3 & SDKA_3 - SDKA_4 & SDKB_4 - SDKB_3 \\ x_6 - x_5 & SDKA_5 - SDKA_6 & SDKB_6 - SDKB_5 \end{bmatrix} \begin{bmatrix} \varepsilon_g \\ \varepsilon_A \\ \varepsilon_B \end{bmatrix} \quad (39)$$

We now have a 3×3 matrix equation that can in principle be inverted (if the matrix is nonsingular) to solve for $\varepsilon_A$, $\varepsilon_B$, and $\varepsilon_g$. A potential difficulty is that the matrix is in fact singular in the case of a DC input; the first column goes to zero. However, this is not a problem since the singularity obscures only information needed to solve for $\varepsilon_g$. Given the activity in the SDKA and SDKB coefficients enforced by the selection of residue modes, the remaining columns of the matrix provide sufficient information to solve for $\varepsilon_A$ and $\varepsilon_B$. It should be noted that ideally we would only need four rows in the matrix (38), given that there are four unknowns. The residue modes selected for the conversions corresponding to the extra rows in (38) are selected to ensure good numerical properties for the matrix in (39). Table 3 shows one possible pattern of residue mode choices.

TABLE 3

Residue Mode Choices

| | RESIDUE MODE | |
|---|---|---|
| CONVERSION | "A" | "B" |
| 1 | CYCLIC | CYCLIC |
| 2 | CYCLIC | CYCLIC |
| 3 | HIGH | CYCLIC |
| 4 | LOW | CYCLIC |
| 5 | CYCLIC | HIGH |
| 6 | CYCLIC | LOW |

Insight into the effect of residue mode variation can be gained from a qualitative examination of the residue mode plots in FIGS. 27-34. Consider, for example, the choice of residue modes in conversions 3 and 4. Different residue modes are used for ADC "A" while the residue mode for ADC "B" is unchanged. It can be seen from the plots of the SDK coefficients in FIGS. 27-34 that, for any given code x, the value of the SDK coefficient for the "HIGH" residue mode is greater than that for the "LOW" residue mode. Thus it is plausible that $|SDKA_3 - SDKA_4| > |SDKB_4 - SDKB_3|$ even for DC inputs. Behavioral simulations have indicated that for a wide range of input signal conditions (for example: DC, random noise, periodic signals at multiples of the conversion frequency) the activity in matrix coefficients enabled by choosing different residue modes is sufficient to prevent singularity in the matrix coefficients corresponding to $\epsilon_A$ and $\epsilon_B$.

V. Iterative Matrix Solution Procedure

As mentioned previously, matrix inversion is avoided to simplify the digital hardware implementation. It will be seen that the procedure used has the additional advantage of dealing gracefully with matrix singularity. The procedure is based on the Jacobi iteration method which is now briefly reviewed:

Suppose we are trying to solve a linear system $$\underline{S \cdot e} = \underline{d} \Rightarrow \begin{bmatrix} S_{11} & S_{12} & S_{13} \\ S_{21} & S_{22} & S_{23} \\ S_{31} & S_{32} & S_{33} \end{bmatrix} \begin{bmatrix} e_1 \\ e_2 \\ e_3 \end{bmatrix} = \begin{bmatrix} d_1 \\ d_2 \\ d_3 \end{bmatrix} \quad (40)$$

in which the $d_i$ are observations of a system, $e_i$ are unknown parameters we are trying to determine based on the observations, and the $S_{ij}$ are known coefficients describing how the various parameters $e_j$ affect the observations $d_i$.

Expanding the matrix product for the first row gives $$S_{11}e_1 + S_{12}e_2 + S_{13}e_3 = d_1 \quad (41)$$

If we already knew $e_2$ and $e_3$, we could solve for $e_1$. In the Jacobi iteration procedure, we develop the next (new) iteration for $e_1$ using the previous (old) values of $e_2$ and $e_3$:

$$e_1^{(new)} = \frac{1}{S_{11}}\left(d_1 - S_{12}e_2^{(old)} - S_{13}e_3^{(old)}\right) \quad (42)$$

Analogous expressions can be derived for $e_2$ and $e_3$ using the other rows of the S matrix. Expressing the iteration in matrix form gives $$\begin{bmatrix} e_1^{(new)} \\ e_2^{new} \\ e_3^{(new)} \end{bmatrix} = \begin{bmatrix} 1/S_{11} & 0 & 0 \\ 0 & 1/S_{22} & 0 \\ 0 & 0 & 1/S_{33} \end{bmatrix} \quad (43)$$

$$\left(\begin{bmatrix} d_1 \\ d_2 \\ d_3 \end{bmatrix} - \begin{bmatrix} 0 & S_{12} & S_{13} \\ S_{21} & 0 & S_{23} \\ S_{31} & S_{32} & 0 \end{bmatrix} \begin{bmatrix} e_1^{(old)} \\ e_2^{(old)} \\ e_3^{(old)} \end{bmatrix}\right)$$

Problems with Basic Jacobi Iteration for This Application

Considering the iteration in (43), the need for dividing by the diagonal elements $S_{ii}$ is undesirable for (at least) three reasons:

Digital hardware complexity: To keep the digital hardware simple, we prefer to avoid division by anything other than a power of 2. Note that the multiplications required for the $S_{ij}e_j^{(old)}$ terms do not impose an additional complexity burden; the multiplier used for calculating the $(1/G)^k$ lookup tables is available as a shared resource.

Stability of iteration depends on values of $S_{ii}$: If the original S matrix is dominated by its diagonal elements, the iteration in (43) is stable and is guaranteed to converge. If this is not the case, the iteration can be made stable by scaling the matrices in (43). Although we have some influence through residue mode selection, the $S_{ii}$ are to a large extent signal dependent.

3) Numerical sensitivity to values of $S_{ii}$: From (42) and (43) we see that, for example, if $S_{11}$ is small, the large reciprocal applies a large "gain" to the $(d_1 - S_{12}e_2^{(old)} - S_{13}e_3^{(old)})$ term in an effort to "squeeze" $e_1^{(new)}$ information out of $d_1$. The calculation is therefore very sensitive to small errors in the value of $S_{11}$. However from (40) we see that when $S_{11}$ is small, it is very unlikely that there actually is any information to be found in $d_1$, regarding $e_1^{(new)}$. In the worst case of a singular matrix (for example, first column=0 with a DC input), the reciprocal of $S_{11}$ blows up completely. When $S_{11}$ is small we are better off realizing that the equation has little to tell us about $e_1^{(new)}$, and just ignoring the result, and waiting until the next set of six conversions. The desired behavior is similar to that encountered in solving an overdetermined set of equations with singular value decomposition, which gracefully handles poor numerical conditions.

Modifications to Jacobi Iteration

Figure 35:
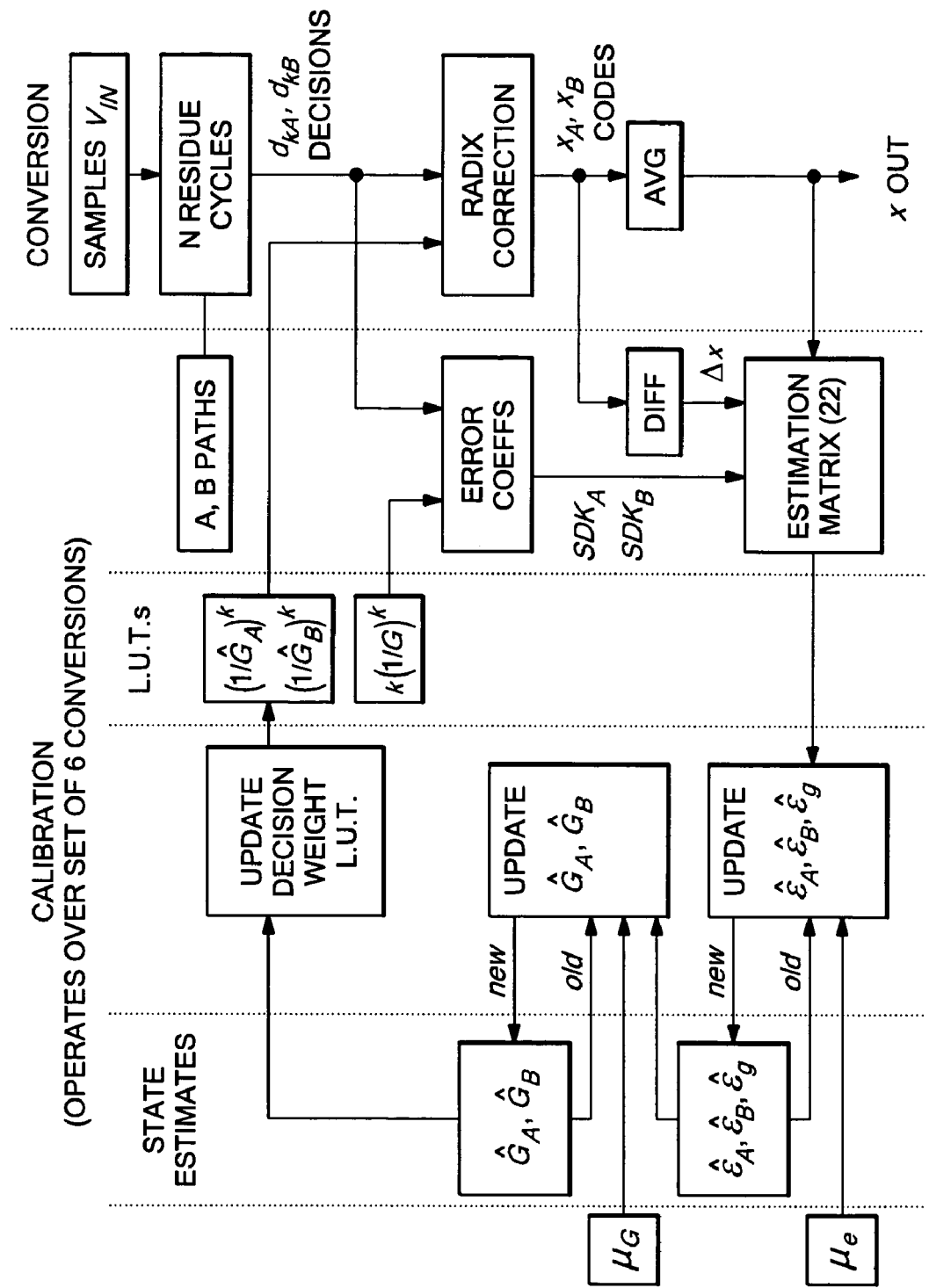
FIG. 35 is a flow chart of the error estimation and calibration process for a cyclic implementation.

The solution proposed in this work is to adopt an LMS-style approach in modifying the Jacobi iteration. A flowchart of the entire calibration procedure as implemented and described below is shown in FIG. 35.

In the method of successive over-relaxation, the new iteration of the $e_i$ is obtained by combining a weighted sum of the matrix operation of (43) with the previous iteration, as follows:

$$\begin{bmatrix} e_1^{(new)} \\ e_2^{new} \\ e_3^{(new)} \end{bmatrix} = [1 - \mu_e]\begin{bmatrix} e_1^{(old)} \\ e_2^{(old)} \\ e_3^{(old)} \end{bmatrix} + \mu_e \begin{bmatrix} 1/S_{11} & 0 & 0 \\ 0 & 1/S_{22} & 0 \\ 0 & 0 & 1/S_{33} \end{bmatrix} \quad (44)$$

$$\left(\begin{bmatrix} d_1 \\ d_2 \\ d_3 \end{bmatrix} - \begin{bmatrix} 0 & S_{12} & S_{13} \\ S_{21} & 0 & S_{23} \\ S_{31} & S_{32} & 0 \end{bmatrix} \begin{bmatrix} e_1^{(old)} \\ e_2^{(old)} \\ e_3^{(old)} \end{bmatrix}\right)$$

Expanding the matrix product for the first row of (44) gives $$e_1^{(new)} = [1 - \mu_e]e_1^{(old)} + \mu_e \frac{1}{S_{11}}\left(d_1 - S_{12}e_2^{(old)} - S_{13}e_3^{(old)}\right) \quad (45)$$

which still has the problems associated with the determining the $1/S_{11}$. To adopt an LMS-style approach, we will abandon hope for an exact solution and just use the sign of $S_{11}$:

$$e_1^{(new)} = [1-\mu_e]e_1^{(old)} + \mu_e[sgn(S_{11})](d_1 - S_{12}e_2^{(old)} - S_{13}e_3^{(old)}) \quad (46)$$

Thus, rather than solve exactly for the $e_i$ using (44), we just take a small step in the direction indicated by $\mu_e[sgn(S_{11})](d_1 - S_{12}e_2^{(old)} - S_{13}e_3^{(old)})$. The factor $\mu_e$ was chosen to be 1/64, which ensures stable convergence of the iteration.

When the approach of (46) is applied to the matrix equation (44), we have $$\begin{bmatrix} e_1^{(new)} \\ e_2^{new} \\ e_3^{(new)} \end{bmatrix} = [1 - \mu_e]\begin{bmatrix} e_1^{(old)} \\ e_2^{(old)} \\ e_3^{(old)} \end{bmatrix} + \mu_e \quad (47)$$

-continued $$\begin{bmatrix} \text{sgn}(S_{11}) & 0 & 0 \\ 0 & \text{sgn}(S_{22}) & 0 \\ 0 & 0 & \text{sgn}(S_{33}) \end{bmatrix}$$

$$\left( \begin{bmatrix} d_1 \\ d_2 \\ d_3 \end{bmatrix} - \begin{bmatrix} 0 & S_{12} & S_{13} \\ S_{21} & 0 & S_{23} \\ S_{31} & S_{32} & 0 \end{bmatrix} \begin{bmatrix} e_1^{(old)} \\ e_2^{(old)} \\ e_3^{(old)} \end{bmatrix} \right)$$

For the hardware implementation, (47) was rearranged to $$\begin{bmatrix} e_1^{(new)} \\ e_2^{(new)} \\ e_3^{(new)} \end{bmatrix} = \begin{bmatrix} e_1^{(old)} \\ e_2^{(old)} \\ e_3^{(old)} \end{bmatrix} - \mu_e \qquad (48)$$

$$\left( \begin{bmatrix} 1 & S_{12} & S_{13} \\ S_{21} & 1 & S_{23} \\ S_{31} & S_{32} & 1 \end{bmatrix} \begin{bmatrix} e_1^{(old)} \\ e_2^{(old)} \\ e_3^{(old)} \end{bmatrix} - \begin{bmatrix} \text{sgn}(S_{11}) & 0 & 0 \\ 0 & \text{sgn}(S_{22}) & 0 \\ 0 & 0 & \text{sgn}(S_{33}) \end{bmatrix} \begin{bmatrix} d_1 \\ d_2 \\ d_3 \end{bmatrix} \right)$$

which is in an LMS form of adding a small update to the previous iteration result. In accord with the LMS principle, the update approaches zero at equilibrium when the e and d are driven to zero. The approach of (48) is used with the data in (39) to develop the estimates $\epsilon_A$ and $\epsilon_B$.

Applying the method of (48) to (39) gives the following $$\varepsilon_g^{(new)} = \varepsilon_g^{(old)} - \qquad (49)$$
$$\mu_e \big( \varepsilon_g^{(old)} + [SDKA_1 - SDKA_2] \varepsilon_A^{(old)} + [SDKB_2 - SDKB_1] \varepsilon_B^{(old)} -$$
$$\text{sgn}(x_2 - x_1)[\Delta x_1 - \Delta x_2] \big)$$
$$\varepsilon_A^{(new)} = \varepsilon_A^{(old)} - \mu_e \big( \varepsilon_A^{(old)} + [x_4 - x_3] \varepsilon_g^{(old)} + [SDKB_4 - SDKB_3] \varepsilon_B^{(old)} -$$
$$\text{sgn}(SDKA_3 - SDKA_4)[\Delta x_3 - \Delta x_4] \big)$$
$$\varepsilon_B^{(new)} = \varepsilon_B^{(old)} - \mu_e \big( \varepsilon_B^{(old)} + [x_6 - x_5] \varepsilon_g^{(old)} + [SDKA_5 - SDKA_6] \varepsilon_A^{(old)} -$$
$$\text{sgn}(SDKB_6 - SDKB_5)[\Delta x_5 - \Delta x_6] \big)$$

In the full SOR method, the iteration would be repeated until the $\epsilon$ values converged to a solution. However, we don't have time for this; we only have available an amount of time corresponding to six conversions. Therefore we update the $\epsilon$ values based on the results of one iteration as carried out in (49), and carry forward the estimated values of $\epsilon$ to be used as the starting point in the iteration corresponding to the next set of six conversions. This does sacrifice accuracy in determining $\epsilon_A$ and $\epsilon_B$, but recall that accuracy in $\epsilon_A$ and $\epsilon_B$ is unnecessary since they are used in a larger LMS loop which eventually drives $\epsilon_A$ and $\epsilon_B$ to zero.

See J. McNeill, M. Coln, and B. Larivee, "'Split-ADC' Architecture for Deterministic Digital Background Calibration of a 16b 1 MS/s ADC," *ISSCC Dig. Tech. Papers*, February 2005 and J. McNeill, M. Coln, and B. Larivee, "'Split-ADC' Architecture for Deterministic Digital Background Calibration of a 16 b 1 MS/s ADC," *IEEE J Solid-State Circuits*, December 2005 incorporated herein by this reference. See also A. Karanicolas et al., "A 15-b 1 MSample/s Digitally Self-Calibrated Pipeline ADC," *IEEE J. Solid-State Circuits*, pp. 1207-1215, December 1993; O. E. Erdogan, P. J. Hurst, and S. H. Lewis, "A 12-b digital-background-calibrated algorithmic ADC with −90-dB THD," *IEEE J. Solid-State Circuits*, pp. 1812-1820, December 1999; Y. Chiu; C. W. Tsang, B. Nikolic, and P. R. Gray, "Least mean square adaptive digital background calibration of pipelined analog-to-digital converters," *IEEE Trans. Circuits and Systems I*, vol. 51, no. 1, pp. 38-46, January 2004; Y. Chiu, "A 1.8V 14 b 10 MS/s Pipelined ADC in 0.18 µm CMOS with 99 dB SFDR," *ISSCC Dig. Tech. Papers*, pp. 458-459, February 2004; J. Li, G. Ahn, D. Chang, and U. Moon, "0.9V 12 mW 2 MSps algorithmic ADC with 81 dB SFDR," *VLSI Symposium Dig. Tech. Papers*, pp. 436-439, 2004; J. Li and U. Moon, "Background calibration techniques for multistage pipelined ADCs with digital redundancy," *IEEE Trans. Circuits and Systems II*, vol. 50, no. 9, pp. 531-538, September 2003.

The split architecture concept of this invention can be applied to three more widely used types of ADCs: pipeline, successive approximation, and interleaved. As an example, below is a description of the concept in an interleaved application. As mentioned above, the cyclic was chosen as the ADC architecture as a lowest-risk approach for the initial hardware test of the Split ADC concept since only two parameters need to be estimated to perform calibration. Extending the split ADC concept to other ADC architectures can be accomplished by those skilled in the art although in each case the self-calibration process may be more complicated since additional parameters may need to be estimated.

Figure 36:
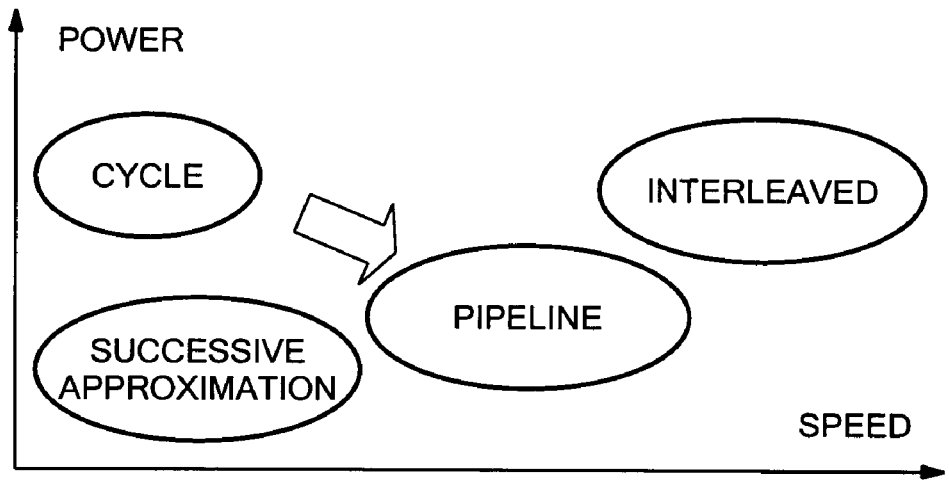
FIG. 36 is a diagram of the relative speed and power of different converter architectures.

FIG. 36 shows a qualitative graphical representation of the speed-power tradeoff for four different types of Nyquist ADCs of equal resolution. Better performance is indicated by the arrow in the figure toward the highest speed, lowest power region of the plot. Due to limitations imposed by the cyclic architecture, the system may be constrained in a way that limits the designer's flexibility in optimizing the speed-power tradeoff. The other architectures shown are not limited by this fundamental constraint, and offer the ability to optimize the speed-power tradeoff for the needs of a particular application area.

As an example, the following section provides a brief overview of the interleaved converter and techniques for applying the split ADC calibration concept in this case.

Figure 37:
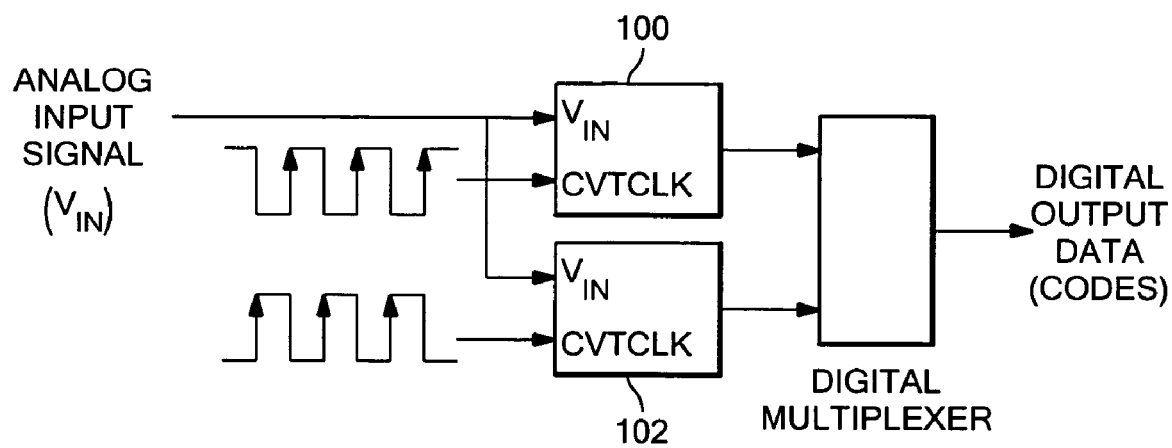
FIG. 37 is a simplified block diagram of a general interleaved ADC.

An interleaved ADC architecture as shown in FIG. 37 pushes the tradeoff to maximize speed at the expense of power. Multiple ADCs 100 and 102 are interleaved in time to increase the overall throughput rate. For the example shown in FIG. 37 with two interleaved converters, the convert start clocks CVTCLK are 180° out of phase. In the general case of N interleaved converters, the converters are clocked in phase increments of 360°/N.

Figure 38:
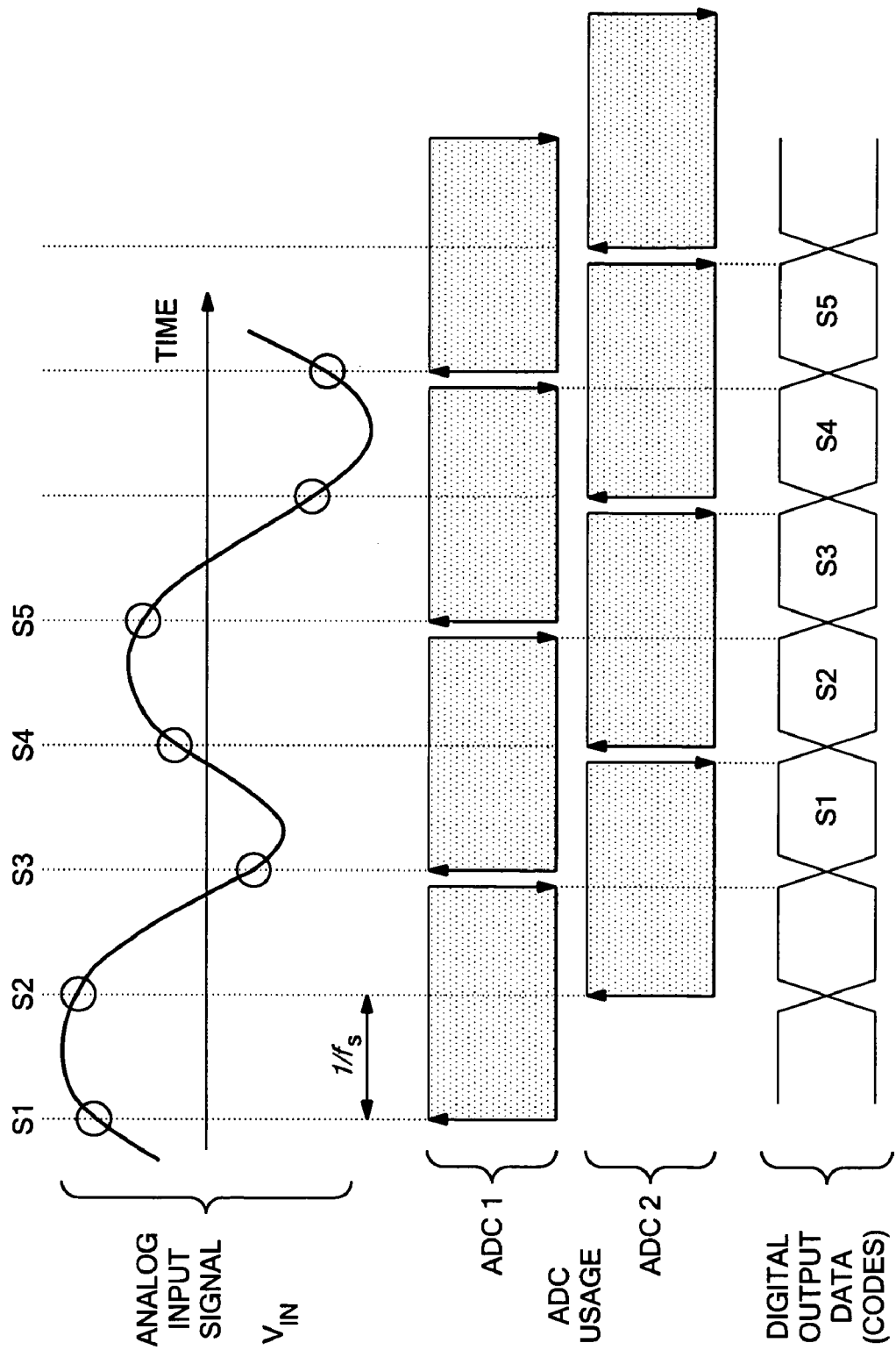
FIG. 38 is a timing diagram for the interleaved ADC of FIG. 37.

FIG. 38 shows a more detailed diagram of the timing relationships among the input signal being sampled, the utilization of each ADC in time, and the output data flow. The shaded circles indicate the samples of the analog input signal, which are spaced at intervals of $1/f_S$, where $f_S$ is the sample rate of the entire converter. Since the convert clocks for the converters are spaced at 180° phase intervals, each converter operates at $f_S$, half the overall sampling rate. In the general case of N interleaved converters, each converter operates at $f_S/N$.

The usage of each ADC in time for the conversion process is indicated by the shaded boxes in the figure. The rising arrow at the leading edge of the rectangle indicates the sampling of the input waveform and the start of the conversion process. The falling arrow at the trailing edge of the rectangle indicates the completion of the conversion process, and availability of the digital output data. The digital outputs of each converter are multiplexed together as they become available, giving an output data flow at the full rate $f_S$. The relationship between input samples S1, S2, . . . and the corresponding digital outputs is also indicated in the figure.

While each of the interleaved ADCs should be calibrated to minimize ADC linearity errors, there are additional difficulties associated with the interleaved approach. Even if ADC linearity is perfect, any mismatch in gain, offset, or aperture delay between converters leads to errors in the output data. These errors take the form of increased noise and spurs in a frequency-domain representation of the output. Gain mismatches lead to signal-dependent spurs, offset mismatches lead to signal-independent spurs, and aperture delay mismatch leads to signal-dV/dt-dependent spurs. Without correcting these errors, the performance of the overall ADC can be severely degraded relative to the performance expected from any individual ADC. For example, in interleaved 8 bit ADCs resulted in an ENOB of only 4-5 bits. To calibrate the system, the gain, offset, and aperture delay of each ADC must be estimated and corrected either digitally or by adjusting offset, gain, and delay in the analog circuitry.

Previous approaches for background calibration of interleaved converters involve complicated DSP, imposing severe die area penalties. Additionally, the prior methods fail for "unsuitable" input signals.

Figure 39:
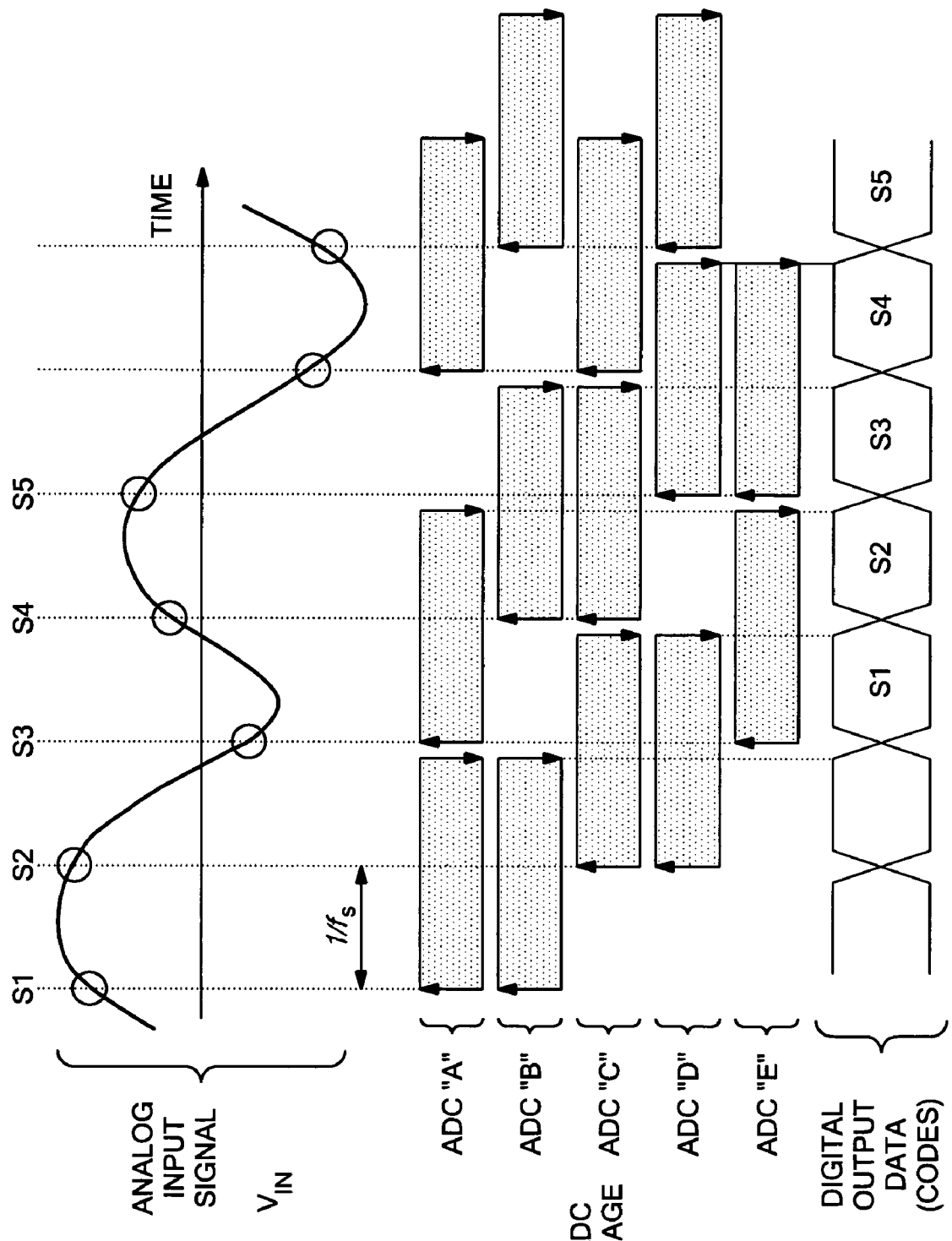
FIG. 39 is a simplified block diagram of an interleaved ADC in accordance with the subject invention.

To apply the split ADC approach to an interleaved converter, each ADC is split as discussed above. The idea is to have all possible combination of ADC split pairs convert the input signal. As shown in the example of FIG. 39, sample S1 is processed by a split ADC composed of ADCs "A" and "B"; sample S2 uses ADCs "C" and "D"; sample S3 uses ADCs "E" and "A", and so on. In this way each converter is paired with every other converter at some time. In each case, the average of whichever two ADCs are used is reported as the output code and the difference is used for the calibration signal. From the resulting differences it will be possible to estimate the gain, offset, and aperture delay mismatch errors of each ADC. Note that one additional split channel is necessary to provide timing flexibility so that all possible pair permutations are used. This does impose a small die area penalty (fractional increase of ½N for an interleaving factor of N ADCs), but imposes no power penalty since there is always one of the splits which is not used and need not be powered.

The main difficulty for the split ADC approach in the case of interleaved converters is the increased number of parameters that need to be estimated. For an interleaving factor of N, the split ADC approach requires estimation of gain, offset, and aperture delay for each of (2N+1) converters, for a total of 3(2N+1) parameters to be estimated. In the case of the N=2 interleaving shown, 9 parameters are necessary, which is a dramatic increase from the two parameter estimation demonstrated in the cyclic case. If split ADC techniques are also used to correct for linearity errors in each individual ADC, the number of parameters to be estimated increases further.

Figure 40:
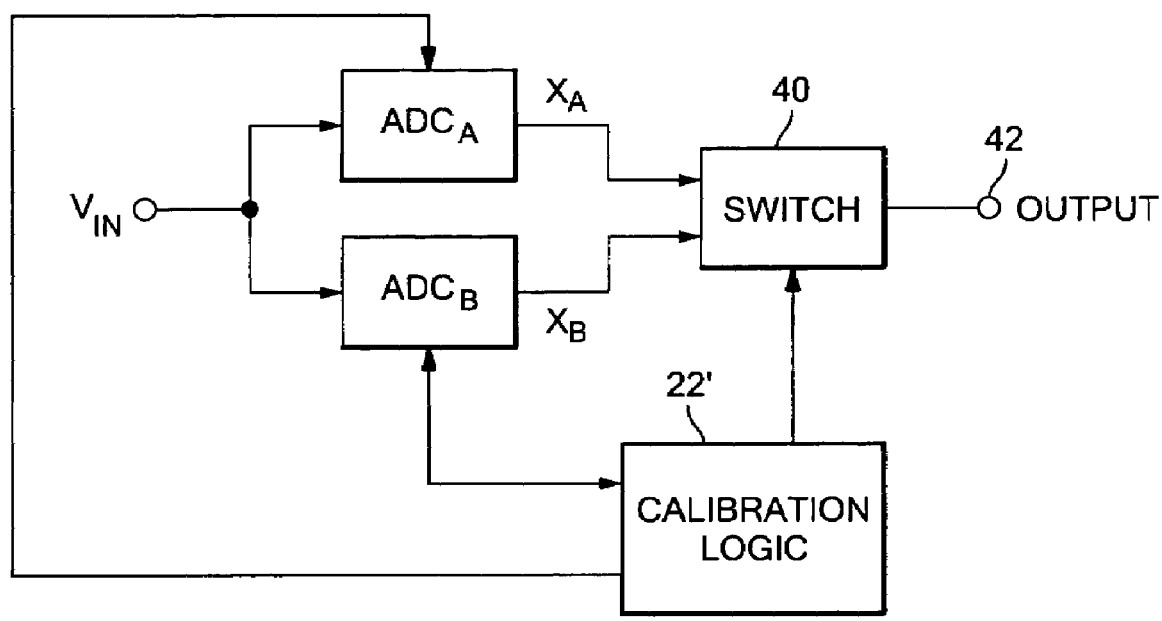
FIG. 40 is a highly schematic block diagram of another example of a calibratable analog-to-digital converter system in accordance with the subject invention.

In still another embodiment, calibration logic 22', FIG. 40 is configured to calibrate $ADC_A$ while $ADC_B$ converts the analog signal at the input to a digital signal. Calibration logic 22' is further configured to calibrate $ADC_B$ while $ADC_A$ converts the analog input signal into a digital signal. Calibration logic 22' thus drives both $ADC_A$ and $ADC_B$ and also switch 40 to couple the outputs of the ADCs to output 42 to provide the appropriate digital output code. If there are more than two ADCs, calibration logic 22' can be configured to calibrate one ADC while the other ADCs provide their digital signals averaged as discussed above with respect to FIG. 1 to produce the system output signal.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A calibratable analog-to-digital converter system comprising:
   a split analog-to-digital converter architecture including N Analog-to-Digital Converters (ADCs) each configured to convert the same analog input signal into a digital signal; and
   calibration logic, responsive to the digital signals output by the N ADCs, and configured to calibrate each of the ADCs based on the digital signals output by each ADC.

2. The system of claim 1 further including averaging logic for averaging the digital signals output by the ADCs to produce a system output signal.

3. The system of claim 1 further including logic for differencing the digital signals output by the ADCs, the calibration logic responsive to the differencing and configured to calibrate the ADCs until the difference in the digital signals output by the ADCs is minimized.

4. The system of claim 3 in which each ADC includes redundancy and the calibration logic is configured to drive each ADC to produce its digital signal based on the analog input signal via a different sequence of decisions.

5. The system of claim 4 in which the calibration logic is responsive to the decisions of each ADC and the differences between the digital signals output by each ADC, and the calibration logic is configured to calculate the errors in each ADC and to drive the errors to a minimum.

6. The system of claim 5 in which each ADC has an architecture selected from the group consisting of SAR, cyclic, and pipeline ADC architectures.

7. The system of claim 1 in which each ADC occupies approximately 1/N of the die area of the system.

8. The system of claim 1 in which each ADC consumes approximately 1/N of the power of the system.

9. The system of claim 1 in which the calibration logic is deterministic, background, and digital.

10. The system of claim 1 in which the ADCs are interleaved.

11. The system of claim 1 in which N equals 2.

12. The system of claim 1 in which N is greater than 2.

13. A calibratable analog-to-digital converter system comprising:
- a split analog-to-digital converter architecture including N redundant Analog-to-Digital Converters (ADCs) each configured to convert the same analog input signal into a digital signal;
- logic for differencing the digital signals output by the ADCs; and
- calibration logic configured to drive each ADC to produce its digital signal based on the analog input signal via a different sequence of decisions and to calculate the errors in each ADC and to drive the errors to a minimum.

14. The system of claim 13 further including averaging logic for averaging the digital signals output by the ADCs to produce a system output signal.

15. The system of claim 13 in which each ADC occupies substantially 1/N of the die area of the system.

16. The system of claim 13 in which each ADC consumes substantially 1/N of the power of the system.

17. The system of claim 13 in which the calibration logic is deterministic, background, and digital.

18. The system of claim 13 in which the ADCs are interleaved.

19. An analog-to-digital converter calibration method comprising:
- driving N Analog-to-Digital Converters (ADCs) to each convert the same analog input signal into N digital signals; and
- using the N digital signals output by the ADCs to calibrate each ADC.

20. The method of claim 19 further including the step of averaging the digital signals output by the ADCs to produce a system output signal.

21. The method of claim 19 further including the step of differencing the digital signals output by the ADCs and using the differences to calibrate the ADCs.

22. The method of claim 19 in which calibration includes driving each ADC to produce its digital output signal based on the analog input signal via a different sequence of decisions.

23. The method of claim 22 in which calibration includes calculating the errors in each ADC and driving the errors to a minimum.

24. The method of claim 19 in which calibration is performed deterministically, in the background, and in the digital domain.

25. An ADC calibration method comprising:
- driving N Analog-to-Digital Converters (ADCs) to each convert the same analog input signal into N digital signals; and
- calibrating each of the ADCs based on the digital signal output by each ADC.

26. The method of claim 25 further including the step of averaging the digital signals output by the ADCs to produce a system output signal.

27. The method of claim 25 further including the step of differencing the digital signals output by the ADCs and using the differences to calibrate the ADCs.

28. The method of claim 27 in which calibration includes driving each ADC to produce its digital output signal based on the analog input signal via a different sequence of decisions.

29. The method of claim 28 in which calibration includes calculating the errors in each ADC and driving the errors to a minimum.

30. The method of claim 25 in which calibration is performed deterministically, in the background, and in the digital domain.

31. A calibratable analog-to-digital converter system comprising:
- a split Analog-to-Digital Converter (ADC) architecture including N ADCs each configured to convert the same analog input signal into a digital signal;
- calibration logic configured to calibrate one ADC while at least one other ADC converts the analog signal into a digital signal and to calibrate a different ADC while at least another ADC converts the analog signal into a digital signal.

32. The system of claim 31 in which there are first and second ADCs and the calibration logic is configured to calibrate the first ADC while the second ADC provides its digital signal as the system output signal and to calibrate the second ADC while the first ADC provides its digital signal as the system output signal.

33. The system of claim 31 in which there are more than two ADCs and the calibration logic is configured to calibrate one ADC while the other ADCs provide digital signals averaged to produce the system output signal.

* * * * *